United States Patent
Lee et al.

(10) Patent No.: US 7,183,202 B2
(45) Date of Patent: Feb. 27, 2007

(54) METHOD OF FORMING METAL WIRING IN A SEMICONDUCTOR DEVICE

(75) Inventors: Sang-Jin Lee, Seoul (KR); Kyung-Tae Lee, Gangnum-gu (KR); Byung-Jun Oh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 156 days.

(21) Appl. No.: 10/989,668

(22) Filed: Nov. 17, 2004

(65) Prior Publication Data

US 2005/0153541 A1    Jul. 14, 2005

(30) Foreign Application Priority Data

Dec. 4, 2003    (KR) .................. 10-2003-0087414

(51) Int. Cl.
*H01L 21/4763* (2006.01)

(52) U.S. Cl. ................. 438/638; 438/702; 257/E21.579

(58) Field of Classification Search ............... 438/638, 438/631, 702; 257/E21.024, E21.035, E21.579
See application file for complete search history.

(56) References Cited

U.S. PATENT DOCUMENTS

| | | | |
|---|---|---|---|
| 6,140,226 A * | 10/2000 | Grill et al. ................ 438/637 |
| 6,492,734 B2 | 12/2002 | Watanabe .................. 257/758 |
| 6,589,711 B1 | 7/2003 | Subramanian et al. |
| 2002/0182874 A1* | 12/2002 | Wang ......................... 438/706 |
| 2003/0092260 A1* | 5/2003 | Lui et al. .................... 438/638 |
| 2004/0036076 A1* | 2/2004 | Arita et al. ................... 257/79 |
| 2005/0124152 A1* | 6/2005 | Meagley et al. ............ 438/631 |

FOREIGN PATENT DOCUMENTS

| JP | 2002-124568 | 4/2002 |
|---|---|---|
| KR | 1020020037805 A | 5/2002 |
| KR | 1020020088399 | 11/2002 |

* cited by examiner

*Primary Examiner*—Caridad Everhart
(74) *Attorney, Agent, or Firm*—Volentine & Whitt, PLLC

(57) ABSTRACT

A method of forming metal wiring in a semiconductor device is disclosed. The method uses a dual damascene process in which a trench is formed prior to a via-hole.

20 Claims, 27 Drawing Sheets

METHOD OF FORMING METAL WIRING IN A SEMICONDUCTOR DEVICE

BACKGROUND OF THE INVENTION

1. Field of the Invention

The present invention relates generally to a method of forming metal wiring in a semiconductor device. More particularly, the present invention relates to a method of forming metal wiring in a semiconductor device using a dual damascene process in which a trench is formed prior to a via-hole.

A claim of priority is made to Korean Patent Application No. 2003-87414, filed on Dec. 4, 2003, the disclosure of which is incorporated herein by reference in its entirety.

2. Description of the Related Art

Due to the current level of integration in modern semiconductor devices, metal wiring layer having a multi-layer structure has become an important part of many semiconductor devices. As the degree of integration in semiconductor devices continues to increase, the space between the layers in the multi-layer wiring structure decreases accordingly. As a result, parasitic resistance and parasitic capacitance between horizontally and vertically adjacent wiring layers increases, thereby causing an increasingly significant impact on the performance of many semiconductor devices.

Increasing parasitic resistance and capacitance in a semiconductor device typically decreases the device's performance by causing signal delays, increasing power consumption, and increasing leakage current. Accordingly, a modern semiconductor device having a multi-layer wiring structure with small parasitic resistance and capacitance is desired.

Parasitic resistance and capacitance are typically minimized in a multi-layer wiring structure where the wiring is formed from a metal having a low specific resistance and where an insulating layer formed from a dielectric material having a low dielectric constant is used. Intensive research has been conducted on the use of copper as a low specific resistance material for use in the formation of metal wiring.

Where copper is used as a metal wiring material, the resulting wiring pattern is generally formed not by a photolithography process, but rather by a dual damascene process. FIGS. 1A through 1F are cross sectional views illustrating the formation of metal wiring in a semiconductor device according to a conventional dual damascene process.

Referring to FIG. 1A, a conductive layer 20 is formed on a semiconductor substrate 10 and a first stopping layer 30 is formed on conductive layer 20. An insulating interlayer 40 is formed on first stopping layer 30 and a second stopping layer 50 is formed on insulating interlayer 40.

Referring to FIG. 1B, a first photoresist pattern 60 is formed on second stopping layer 50.

First photoresist pattern 60 comprises first and second openings 70a and 70b, which partially expose second stopping layer 50. First opening 70a is wider than second opening 70b. Accordingly, first opening 70a forms a relatively large via-hole and second opening 70b forms a relatively small via-hole.

Referring to FIG. 1C, second stopping layer 50 and insulating interlayer 40 are partially etched using first photoresist pattern 60 as an etching mask to form a third opening 80a having a first width W1 and a fourth opening 80b having a second width W2. Third and fourth openings 80a and 80b form via-holes partially exposing first stopping layer 30. Following the formation of third and fourth openings 80a and 80b, first photoresist pattern 60 is completely removed. After being partially etched, second stopping layer 50 and insulating interlayer 40 are referred to as second stopping layer 50a and insulating interlayer 40a, respectively.

Referring to FIG. 1D, a mask layer 90 filling third and fourth openings 80a and 80b is formed on second stopping layer 50a and an anti-reflection layer 100 is formed on mask layer 90 to prevent reflection from the mask layer in a subsequent photolithography process. Mask layer 90 prevents a focus failure from occurring in the subsequent photolithography process. In the absence of a mask layer, the focus failure generally occurs during an exposing process of the subsequent photolithography process where light fails to properly focus due to a large width of a pattern formed in a device being etched. For example, a focus failure could occur due to a width of a trench corresponding to first opening 70a formed in photoresist pattern 60.

Referring to FIG. 1E, a second photoresist pattern 110 used to form a trench is formed on anti-reflection layer 100. Second photoresist pattern 110 includes a fifth opening 120a and a sixth opening 120b, which partially expose anti-reflection layer 100. A width of a trench corresponding to fifth opening 120a is greater than first width W1 and a width of a trench corresponding to sixth opening 120b is greater than second width W2 of fourth opening 80b.

Photoresist pattern 110 is formed by first forming a photoresist film (not shown) on anti-reflection layer 100 and then exposing and developing the photoresist film.

Referring to FIG. 1F, anti-reflection layer 100, mask layer 90, second stopping layer 50a, and insulating interlayer 40a are successively etched using second photoresist pattern 110 as an etching mask. Then, mask layer 90, second photoresist pattern 110 and anti-reflection layer 100 are completely removed. After second stopping layer 50a and insulating interlayer 40a are etched, they are referred to as second stopping layer 50b and insulating interlayer 40b.

The foregoing etching and removing processes form third and fourth openings 80a and 80b, which partially expose first stopping layer 30. The etching and removing processes further form seventh and eighth openings 130a and 130b connected to third and fourth openings 80a and 80b, respectively. Seventh opening 130a has a third width W3, which is larger than first width W1, and eighth opening 130b has a fourth width W4, which is larger than second width W2.

Third and fourth openings 80a and 80b function as via-holes and seventh and eighth openings 130a and 130b function as trenches in a metal wiring of a semiconductor device.

FIG. 2 is a cross-sectional view illustrating some problems that typically arise in the conventional dual damascene process.

Referring to FIG. 2, problems arise in the conventional dual damascene process during the etching process using second photoresist pattern 110 as an etching mask and also during the process of removing second photoresist pattern 110 and mask layer 90.

A first problem arises where third opening 80a has a sufficiently large width, as, for example, in a pad region. A portion of first stopping layer 30 is etched away, thus partially exposing conductive layer 20 as shown at a portion "A" in FIG. 2.

A second problem arises where a stepped portion at the interface of third and fourth openings 80a and 80b and trenches 130a and 130b respectively, is formed to be round, as shown at portion "B" in FIG. 2.

A third problem arises where insulating interlayer 40b is partially removed under second stopping layer 50b between insulating interlayer 40b and second stopping layer 50b, as shown at portion "C" in FIG. 2. The partial removal of insulating interlayer 40b under second stopping layer 50b is called an undercut phenomenon.

A fourth problem arises where second stopping layer 50b becomes narrow between seventh and eighth openings 130a and 130b, as shown at a portion "D" in FIG. 2.

The problems described above alter the electrical characteristics of the semiconductor device and often cause metal wiring failures, thereby reducing the reliability of the semiconductor device.

A dual damascene process is disclosed, for example, in U.S. Pat. No. 6,589,711. U.S. Pat. No. 6,589,711 discloses a dual damascene process using a bi-layered mask layer in which a metal wiring pattern is formed using an imaging layer and a bottom anti-reflection coating (BARC).

Because of the problems arising in the conventional dual damascene process, an improved method of forming a metal wiring is desired.

SUMMARY OF THE INVENTION

The present invention provides a method of forming a metal wiring in a semiconductor device using a dual damascene process in which a trench is formed prior to the formation of a via-hole.

According to one aspect of the present invention, a method of forming a metal wiring in a semiconductor device is provided. The method comprises; forming a first stopping layer on a semiconductor substrate on which a conductive layer is formed, forming an insulating interlayer on the first stopping layer, forming a second stopping layer on the insulating interlayer, and forming a preliminary layer on the second stopping layer.

The method further comprises; partially removing the preliminary layer to form a preliminary pattern including a trench region exposing a top surface of the second stopping layer, wherein the trench region has a first width, partially removing the second stopping layer and a portion of the insulating interlayer using the preliminary pattern, thereby forming a trench having the first width, and then removing the preliminary pattern.

The method further comprises; forming a first mask layer on the second stopping layer, wherein the first mask layer fills the trench, forming a second mask layer on the first mask layer, forming a third mask layer on the second mask layer, and partially removing the third mask layer to form a third mask pattern, wherein the third mask pattern comprises a via-hole region exposing a top surface of the second mask layer, wherein the via-hole region has a second width smaller than the first width.

The method further comprises; partially removing the second mask layer using the third mask pattern, thereby forming a second mask pattern, removing the third mask pattern, partially removing the first mask layer using the second mask pattern, thereby forming a first mask pattern, removing the second mask pattern, partially removing the insulating interlayer using the first mask pattern, thereby forming a via-hole partially exposing the first stopping layer, wherein the via-hole has the second width, and removing the first mask pattern.

The first mask layer typically comprises a photoresist film sensitive to an I-line ray or a krypton fluoride (KrF) excimer laser, or a material layer including a spin-on-glass (SOG) based material.

Forming the first mask layer preferably comprises; coating the first mask layer on the second stopping layer to a predetermined thickness sufficient to fill the trench, and planarizing the first mask layer.

Removing the first mask pattern preferably comprises; performing an ashing process or a stripping process using a material having an etch selectivity relative to the insulating interlayer, the first stopping layer and the second stopping layer.

The second mask layer preferably comprises a SOG-based material including carbon (C) having an etch selectivity relative to the first mask layer and the insulating interlayer.

The conductive layer typically comprises copper.

The insulating interlayer preferably comprises silicon oxycarbide (SiOC), fluorine doped silicate glass (FSG) or spin-on-glass (SOG) having a low dielectric constant.

The first stopping layer typically comprises silicon nitride (SiN), silicon carbide (SiC) or silicon carbon nitride (SiCN) having an etch selectivity relative to the insulating interlayer.

The second stopping layer typically comprises fluorine doped silicate glass (FSG) or undoped silicate glass (USG) having a low dielectric constant.

According to another aspect of the present invention, another method of forming a metal wiring in a semiconductor device is provided. The method comprises; forming a first stopping layer on a semiconductor substrate on which a conductive layer is formed, forming a first insulating interlayer on the first stopping layer, forming a second stopping layer on the first insulating interlayer, forming a second insulating interlayer on the second stopping layer, forming a third stopping layer on the second insulating interlayer, and forming a preliminary layer on the third stopping layer.

The method further comprises; partially removing the preliminary layer to form a preliminary pattern, thereby forming a trench region exposing a top surface of the third stopping layer, wherein the trench region has a first width, partially removing the third stopping layer and a portion of the second insulating interlayer using the preliminary pattern, thereby forming a trench partially exposing a top surface of the second stopping layer, wherein the trench has the first width.

The method further comprises; forming a first mask layer on the third stopping layer, wherein the first mask layer fills the trench, forming a second mask layer on the first mask layer, forming a third mask layer on the second mask layer, and partially removing the third mask layer to form a third mask pattern, wherein the third mask pattern comprises a via-hole region exposing a top surface of the second mask layer, wherein the via-hole region has a second width smaller than the first width.

The method further comprises; partially removing the second mask layer using the third mask pattern, thereby forming a second mask pattern, removing the third mask pattern, partially removing the first mask layer using the second mask pattern, thereby forming a first mask pattern, removing the second mask pattern, partially removing the second stopping layer and the first insulating interlayer, thereby forming a via-hole partially exposing the first stopping layer, wherein the via-hole has the second width, and removing the first mask pattern.

Forming the first mask layer typically comprises; coating the first mask layer on the third stopping layer to a predetermined thickness sufficient to fill the trench, and planarizing the first mask layer.

Preferably, the first stopping layer comprises silicon nitride (SiN), silicon carbide (SiC) or silicon carbon nitride (SiCN) having an etch selectivity relative to the first insulating interlayer.

The second stopping layer preferably comprises silicon nitride (SiN), silicon carbide (SiC) or silicon carbon nitride (SiCN) having an etch selectivity relative to the second insulating interlayer.

The third stopping layer preferably comprises fluorine doped silicate glass (FSG) or undoped silicate glass (USG) having a low dielectric constant.

According to the present invention, a via-hole and a trench used to form a metal wiring in a semiconductor device are formed so that the desired electrical characteristics of the metal wiring are maintained. In particular, an electrical short due to a wiring failure is sufficiently prevented.

BRIEF DESCRIPTION OF THE DRAWINGS

The accompanying drawings illustrate multiple selected embodiments of the present invention. In the drawings:

FIGS. 3A through 3J are cross-sectional views illustrating a method of forming a metal wiring in a semiconductor device according to one exemplary embodiment of the present invention; and FIGS. 4A through 4J are cross-sectional views illustrating a method of forming a metal wiring in a semiconductor device according to another exemplary embodiment of the present invention.

DETAILED DESCRIPTION OF THE INVENTION

Figure 1A:
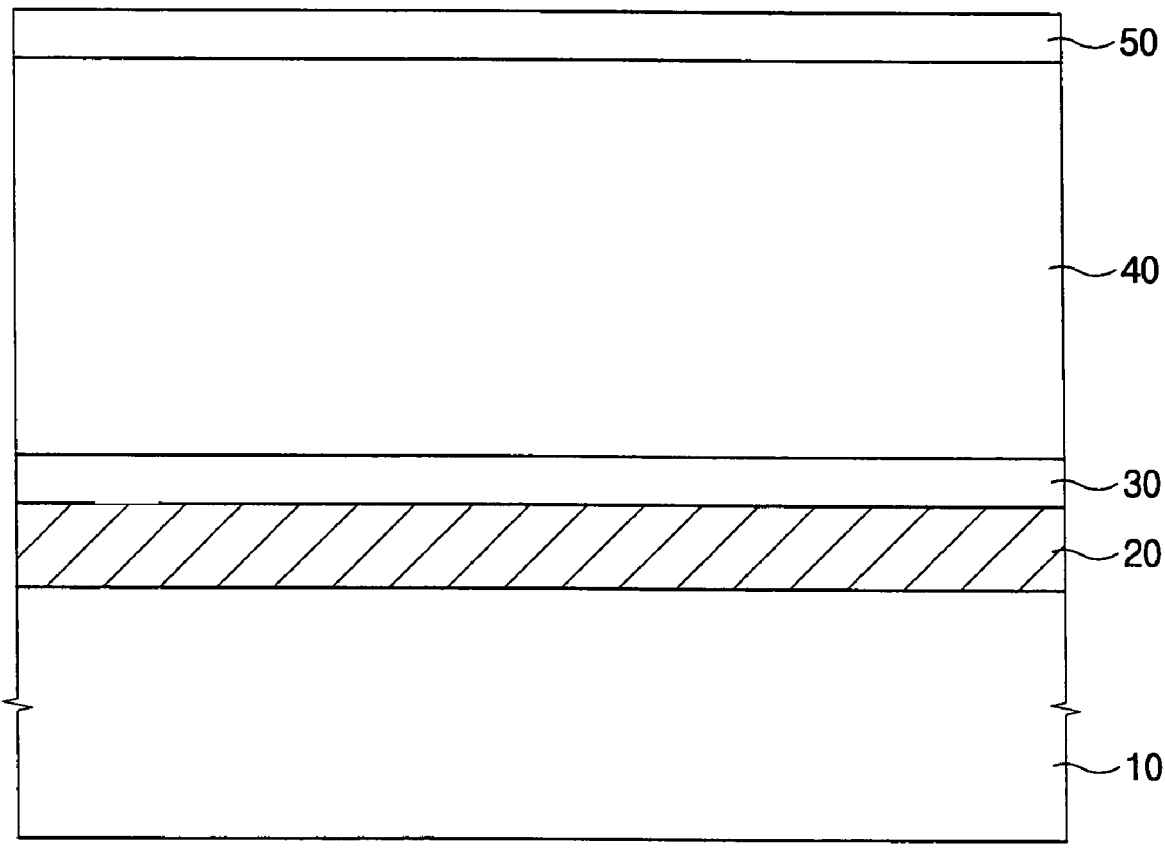
FIGS. 1A through 1F are cross-sectional views illustrating a method of forming a metal wiring in a semiconductor device according to a conventional dual damascene process.
Figure 1B:
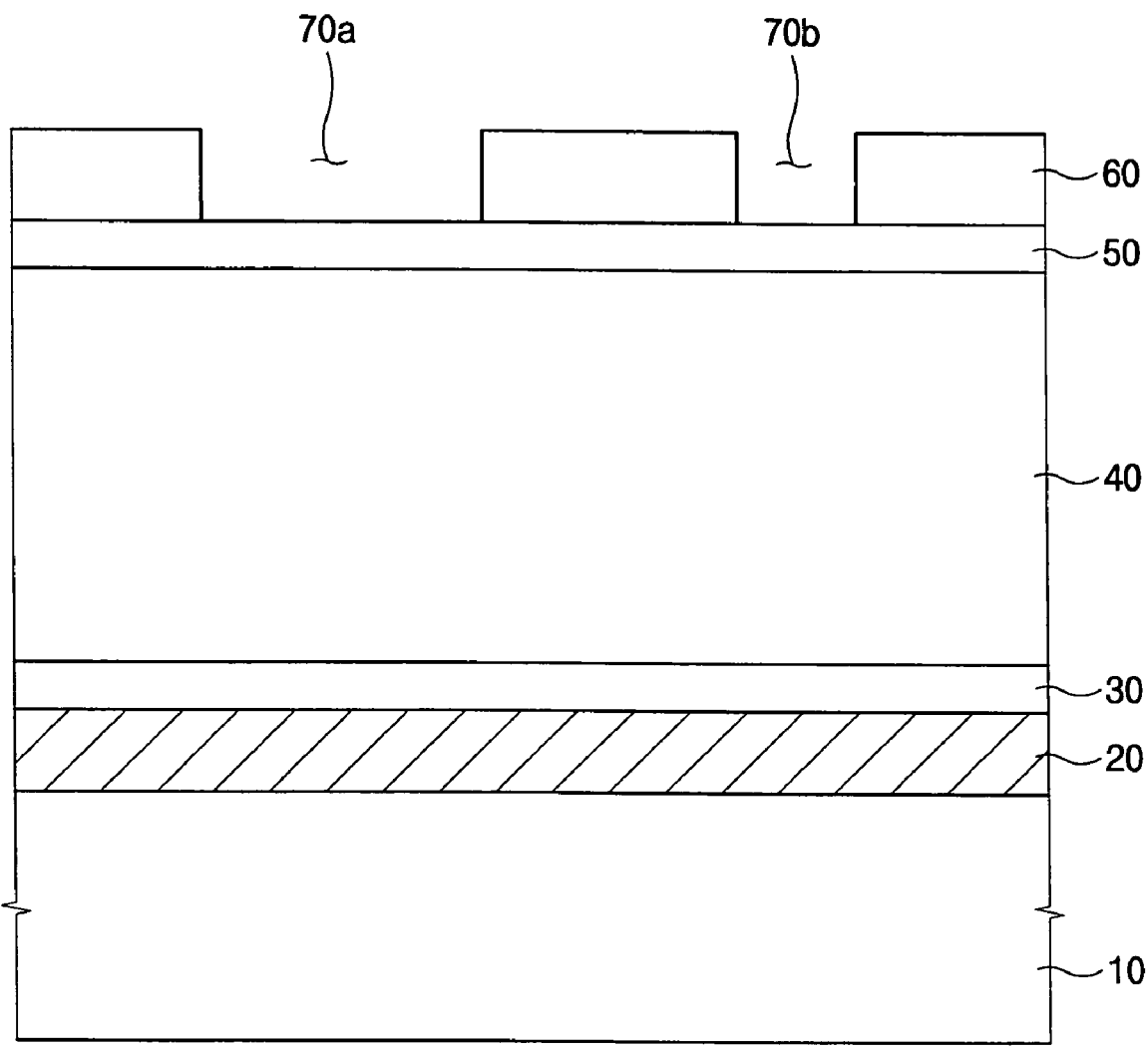
Figure 1C:
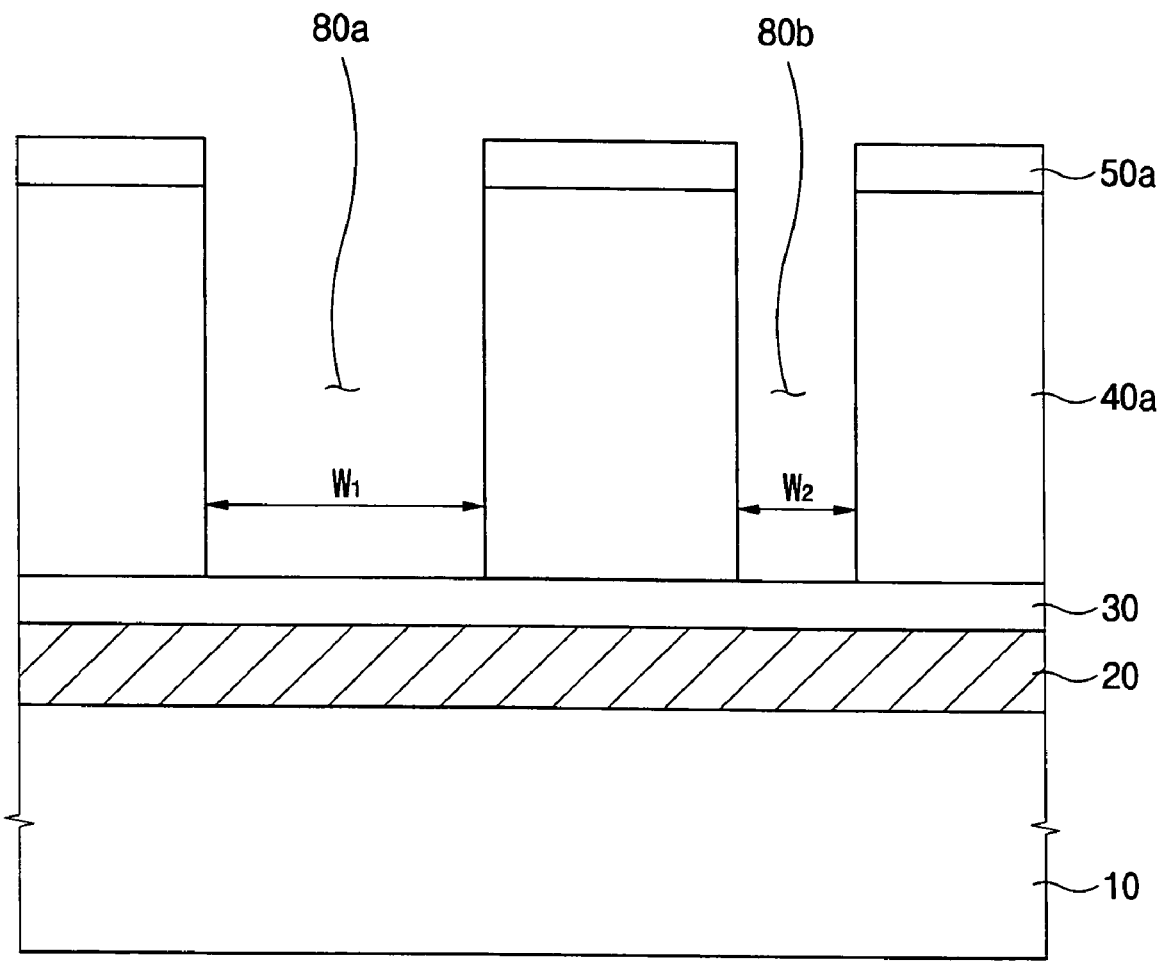
Figure 1D:
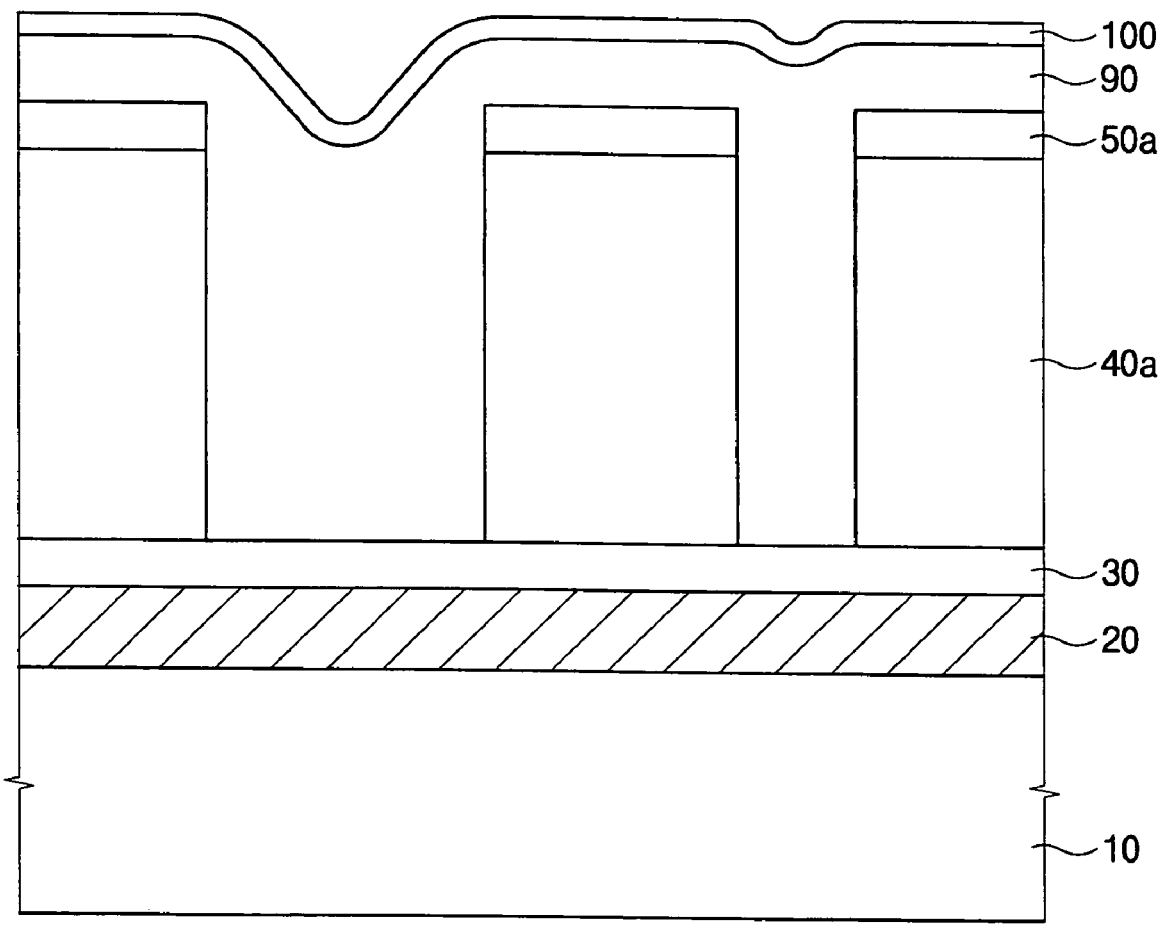
Figure 1E:
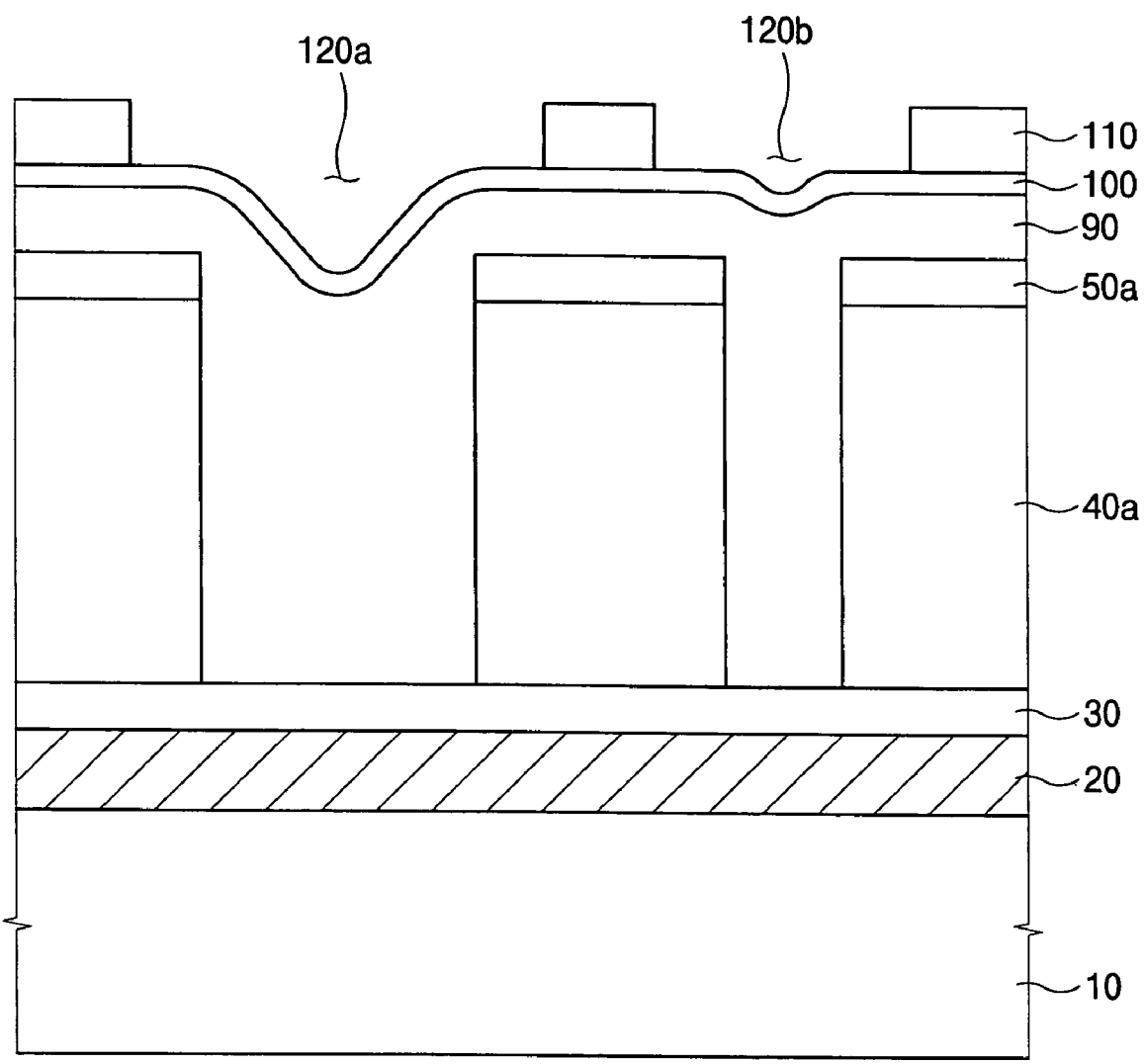
Figure 1F:
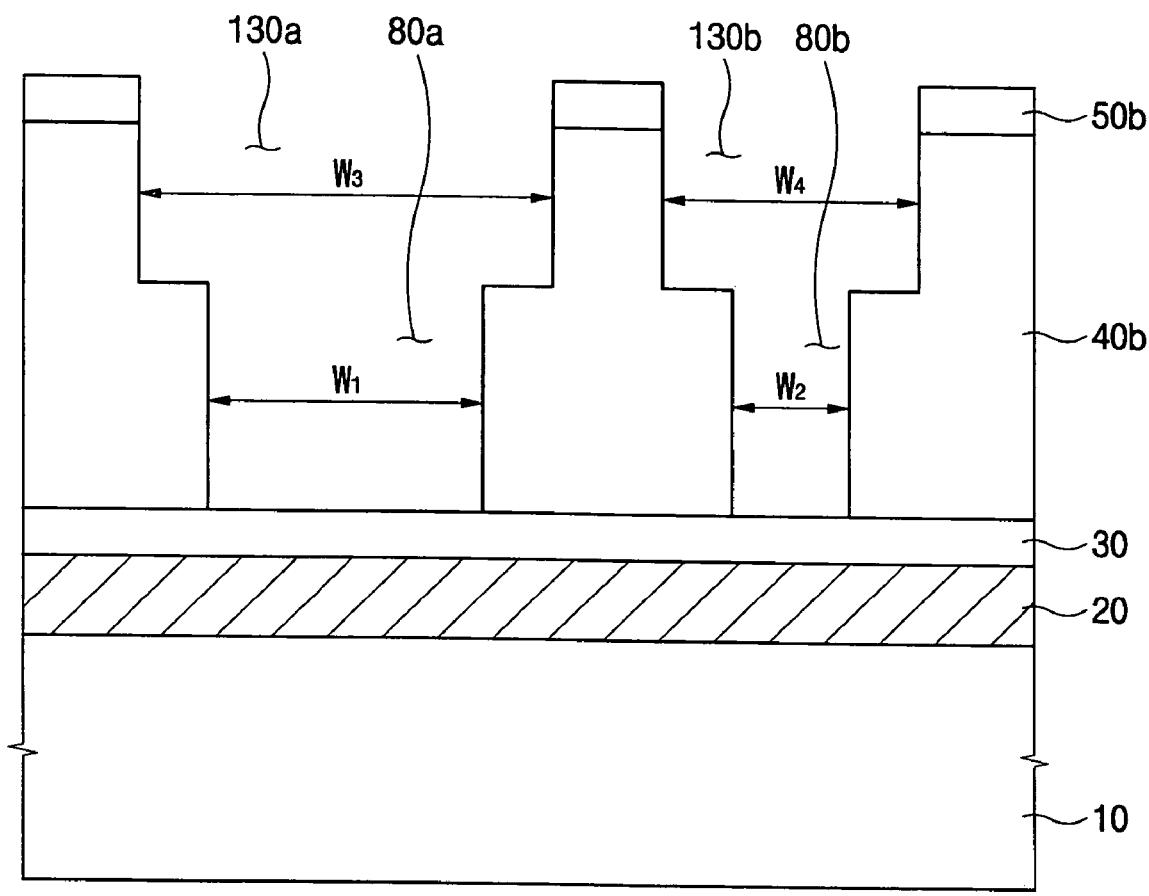
Figure 2:
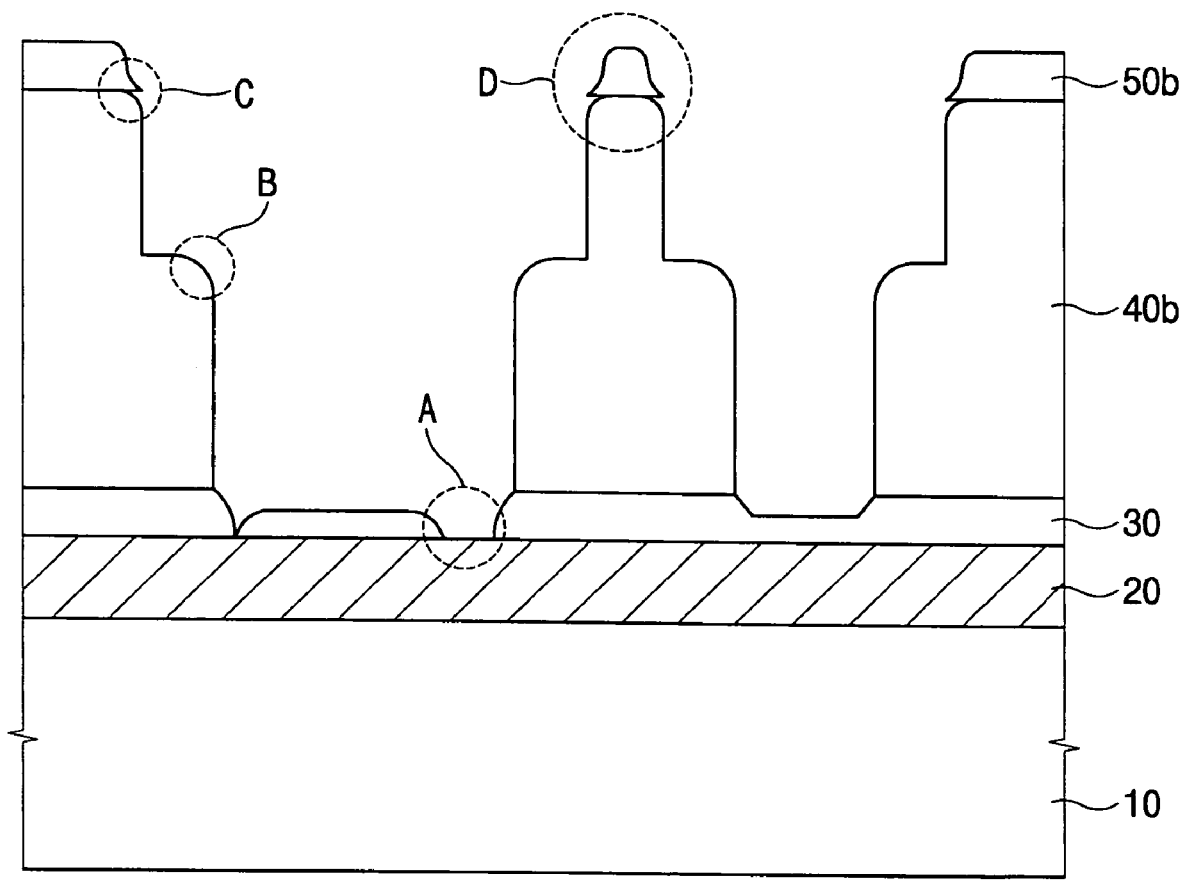
FIG. 2 is a cross-sectional view illustrating some problems that typically arise in the conventional dual damascene process.

The present invention will now be described more fully with reference to the accompanying drawings, in which multiple embodiments of the present invention are shown. In the drawings and corresponding written description, like reference numerals refer to like elements throughout.

FIGS. 3A through 3J are cross-sectional views illustrating a method of forming metal wiring in a semiconductor device according to one exemplary embodiment of the present invention. The metal wiring is formed by a dual damascene process in which a trench is formed prior to a via-hole, contrary to a conventional dual damascene process in which the via-hole is formed prior to the trench.

Figure 3A:
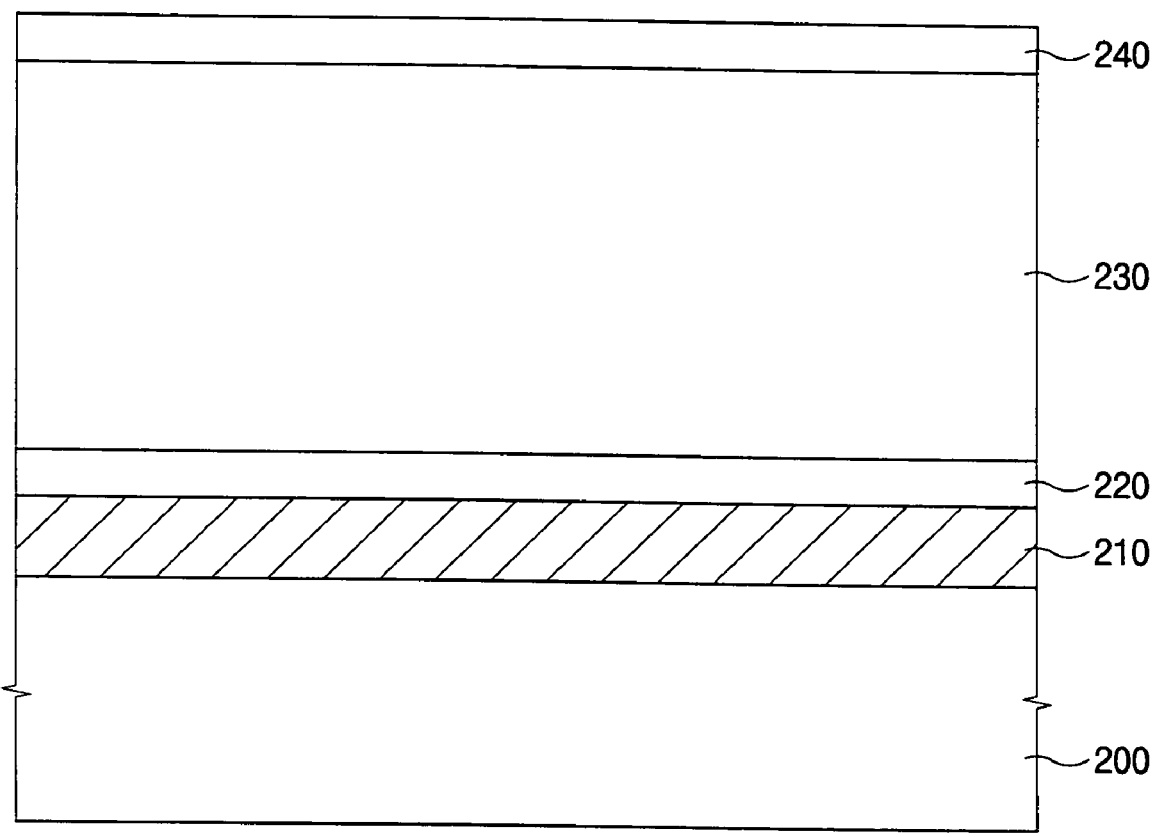

Referring to FIG. 3A, a first conductive layer 210 is formed on a semiconductor substrate and a first stopping layer 220 is formed on the first conductive layer. An insulating interlayer 230 is formed on first stopping layer 220, and a second stopping layer 240 is formed on insulating interlayer 230.

First conductive layer 210 preferably comprises copper and first stopping layer 220 preferably comprises silicon nitride (SiN), silicon carbide (SiC) or silicon carbon nitride (SiCN) having an etch selectivity relative to insulating interlayer 230. First stopping layer 220 stops a removing process, such as an etching process, used to form a via-hole. Insulating interlayer 230 preferably comprises silicon oxycarbide (SiOC), fluorine doped silicate glass (FSG), or spin-on-glass (SOG) having a low dielectric constant. Second stopping layer 240 preferably comprises fluorine doped silicate glass (FSG), or undoped silicate glass (USG) having a low dielectric constant.

Figure 3B:
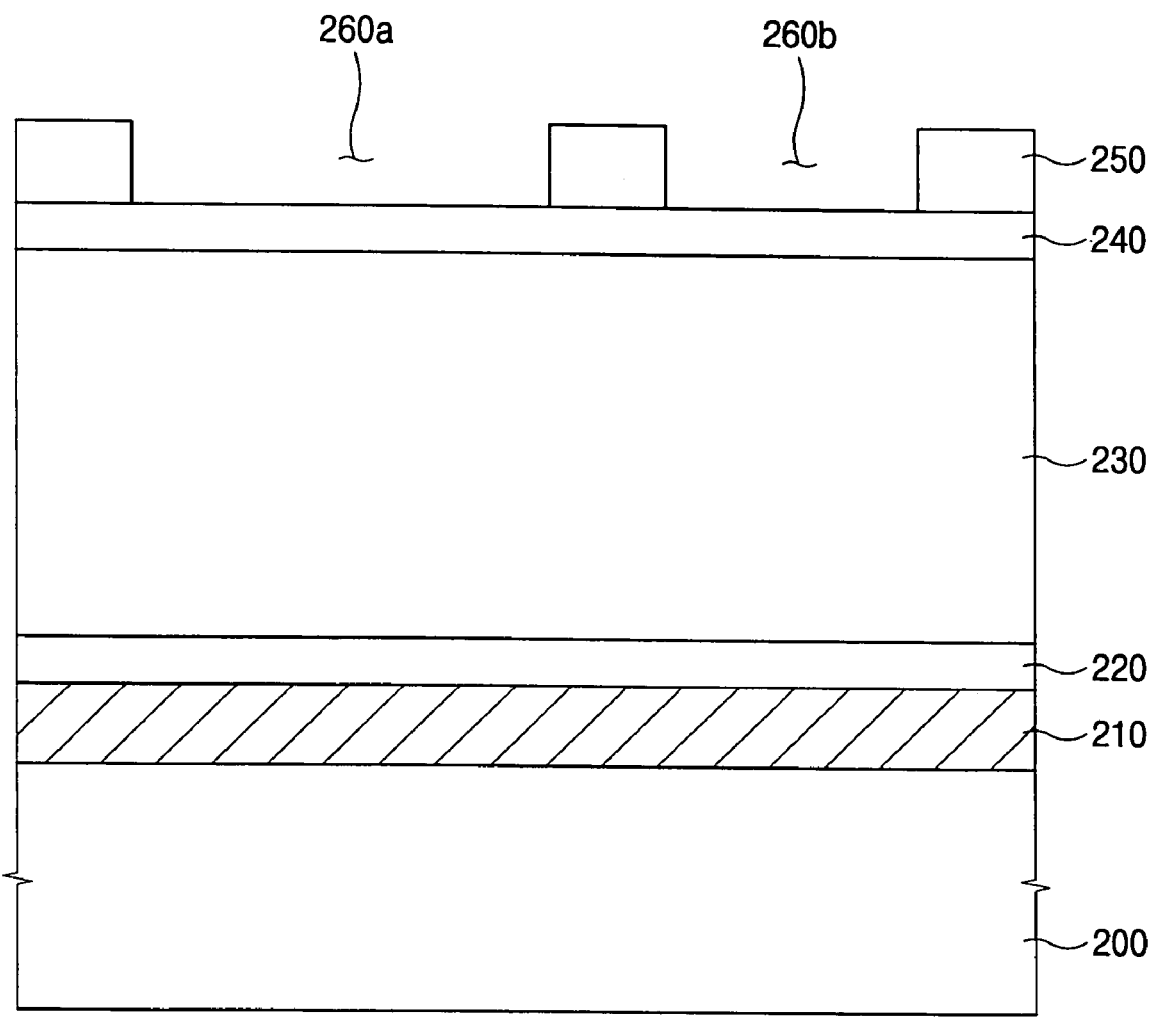

Referring to FIG. 3B, a preliminary pattern 250 is formed on second stopping layer 240 and comprises at least one trench region partially exposing a top surface of second stopping layer 240. In FIG. 3B, a first trench region 260a and a second trench region 260b are formed in preliminary pattern 250. First trench region 260a is wider than second trench region 260b, and therefore second stopping layer 240 is more widely exposed through first trench region 260a than through second trench region 260b. Accordingly, first trench region 260a forms a wide pattern such as a trench in a pad region of a wafer, and second trench region 260b forms a narrow pattern such as a trench in a cell region of a wafer that is strongly constrained by a semiconductor device design rule.

Preliminary pattern 250 is typically formed by first forming a preliminary layer (not shown) on second stopping layer 240, and then partially removing the preliminary layer to form preliminary pattern 250 including first and second trench regions 260a and 260b.

Figure 3C:
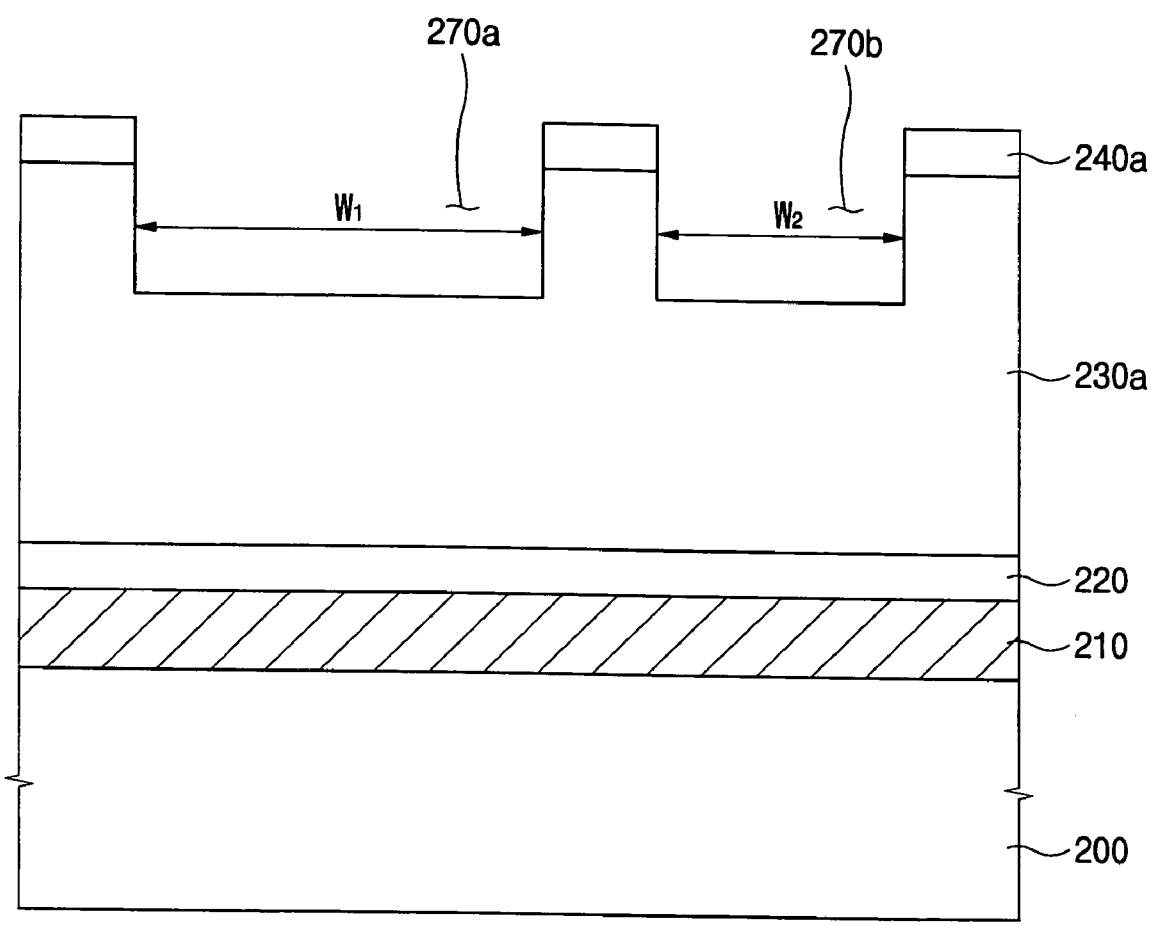

Referring to FIG. 3C, portions of second stopping layer 240 and portions of insulating interlayer 230 are successively removed using preliminary pattern 250 as a mask. Portions of second stopping layer 240 and insulating interlayer 230 are removed to a predetermined depth from a top surface of second stopping layer 240 so that insulating interlayer 230 is partially recessed after second stopping layer 240 is completely removed. Accordingly, at least one trench penetrating second stopping layer 240 is formed on insulating interlayer 230. Second stopping layer 240 and insulating interlayer 230 are respectively referred to as second stopping layer 240a and insulating interlayer 230a following the removal of the aforementioned portions.

A first opening 270a and a second opening 270b now exist where exposed portions of second stopping layer 240 and a portion of insulating interlayer 230 were removed. First opening 270a has a first width W1, and second opening 270b has a second width W2 smaller than the first width W1.

First and second openings 270a and 270b preferably function as trenches. First opening 270a preferably functions as a first trench having first width W1 formed in a pad region. Second opening 270b preferably functions as a second trench having second width W2 formed in a cell region. After first and second openings 270a and 270b are formed, preliminary pattern 250 is completely removed from second stopping layer 240.

Figure 3D:
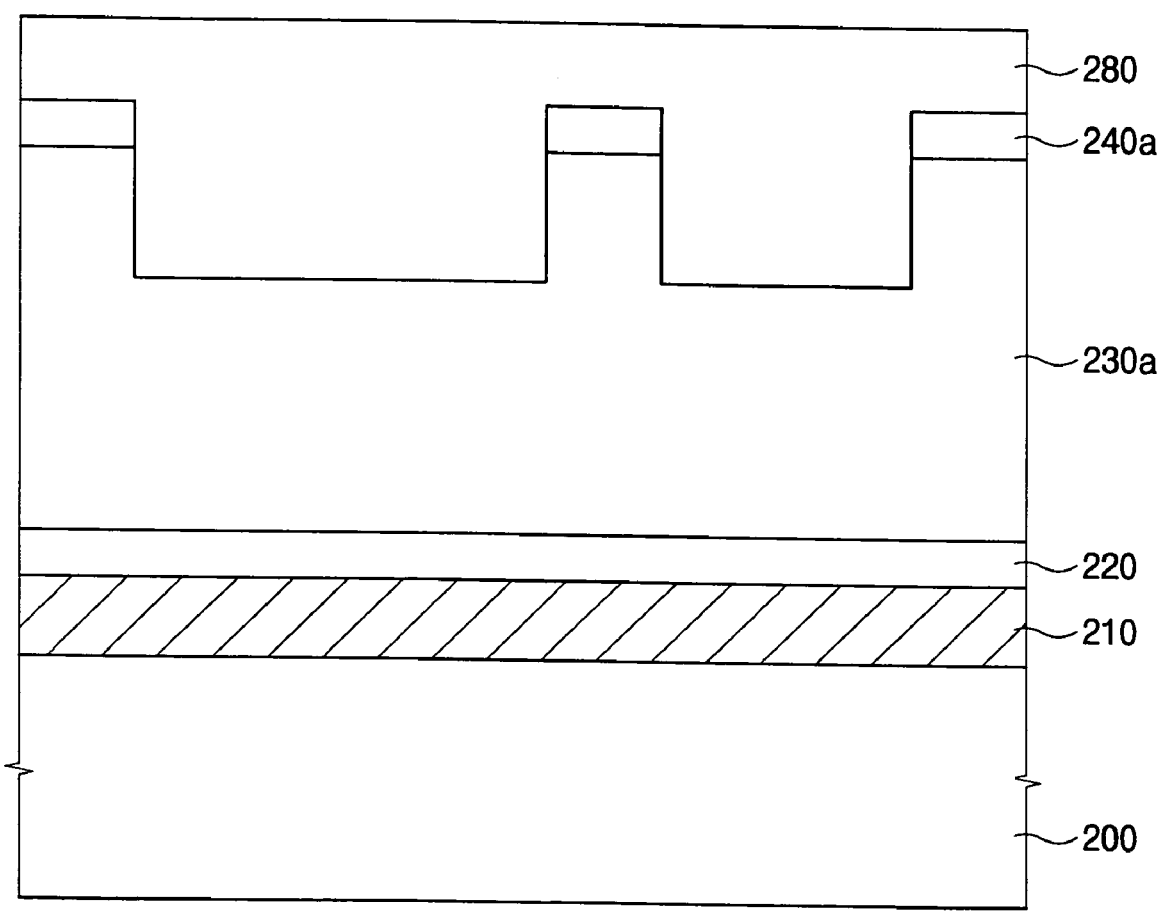

Referring to FIG. 3D, a first mask layer 280 filling first and second openings 270a and 270b is formed on second stopping layer 240a. First mask layer 280 is typically formed by coating second stopping layer 240a to a predetermined thickness sufficient to fill the trenches corresponding to first and second openings 270a and 270b. First mask layer 280 preferably comprises a photoresist film sensitive to an I-line ray or a krypton fluoride (KrF) excimer laser, or a layer including a spin-on-glass (SOG) based material.

Where first mask layer 280 is formed to be very thick from the top surface of second stopping layer 240a, first mask layer 280 is planarized to reduce the thickness thereof. Planarizing first mask layer 280 prevents a process failure from occurring due to a large thickness between a top surface of first mask layer 280 and a bottom surface of first and second openings 270a and 270b. For example, a focus failure is prevented from occurring in a photolithography process used to form a wide pattern such as first opening 270a by reducing the thickness of first mask layer 280.

Figure 3E:
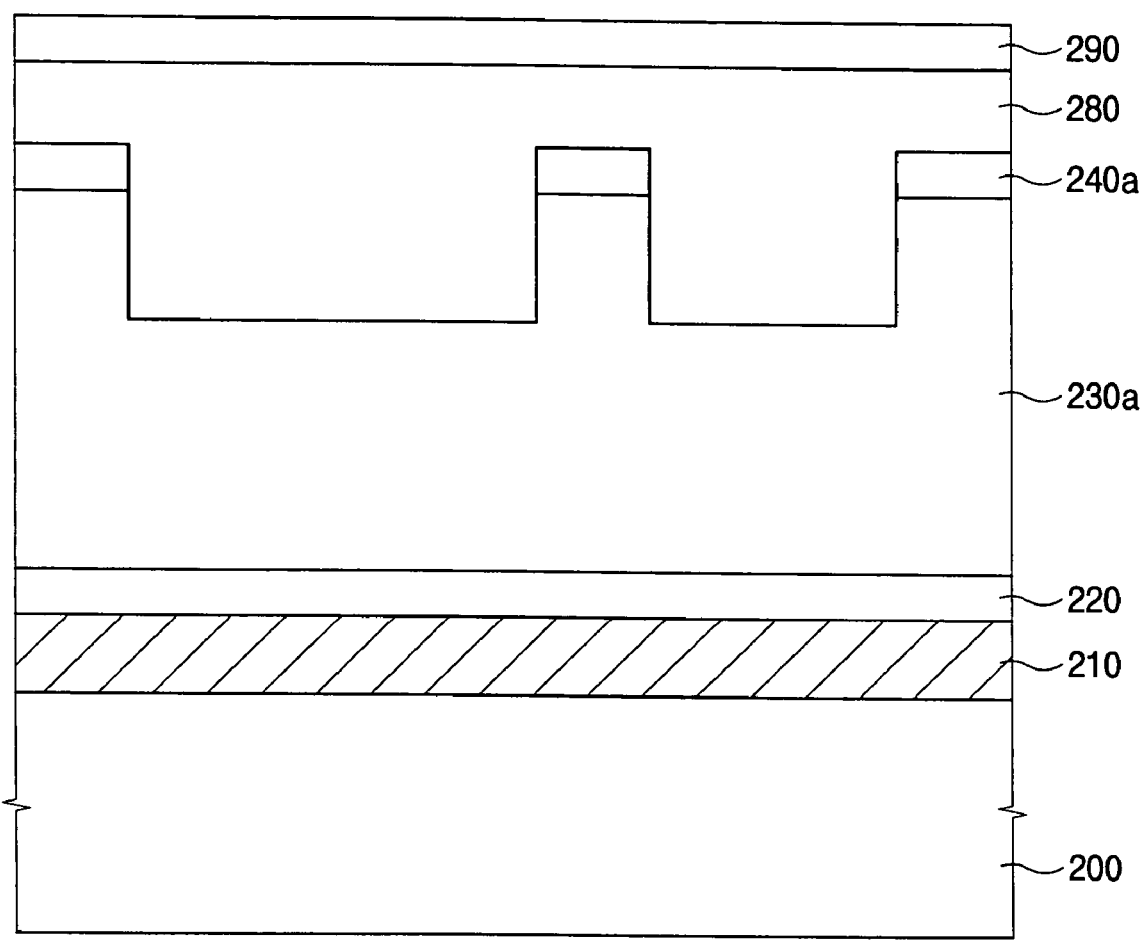

Referring to FIG. 3E, a second mask layer 290 is formed on first mask layer 280. Second mask layer 290 preferably comprises a SOG-based material including carbon (C), having an etch selectivity relative to first mask layer 280 and insulating interlayer 230a.

Figure 3F:
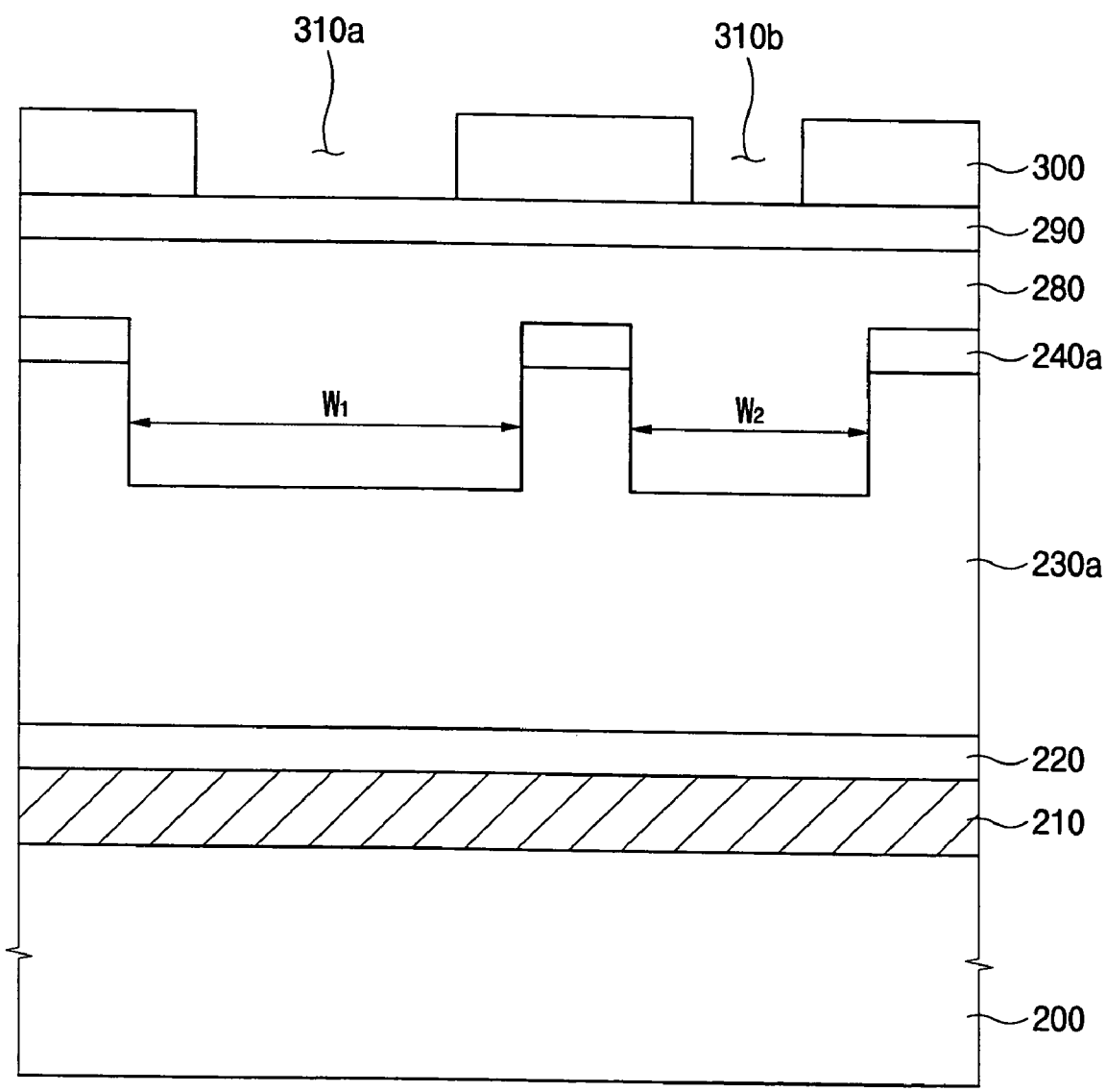

Referring to FIG. 3F, a third mask pattern 300 is formed on second mask layer 290 in order to form a via-hole in a subsequent process. Third mask pattern 300 comprises first and second via-hole regions 310a and 310b partially exposing a top surface of second mask layer 290. First via-hole region 310a is formed to be larger than second via-hole region 310b, and thus a portion of second mask layer 290 exposed through first via-hole region 310a is wider than a portion of second mask layer 290 exposed through second via-hole region 310b. First via-hole region 310a is formed to correspond to first trench region 260a, and second via-hole region 310b is formed to correspond to second trench region 260b. First via-hole region 310a is narrower than first trench region 260a, and second via-hole region 310b is narrower than second trench region 260b. Accordingly, via-holes formed by first and second via-hole regions 310a and 310b are narrower than corresponding trenches formed by respective first and second trench regions 260a or 260b.

Third mask pattern 300 is formed by coating a third mask layer (not shown) on second mask layer 290 and then partially removing third mask layer to form first and second via-hole regions 310a and 310b.

Figure 3G:
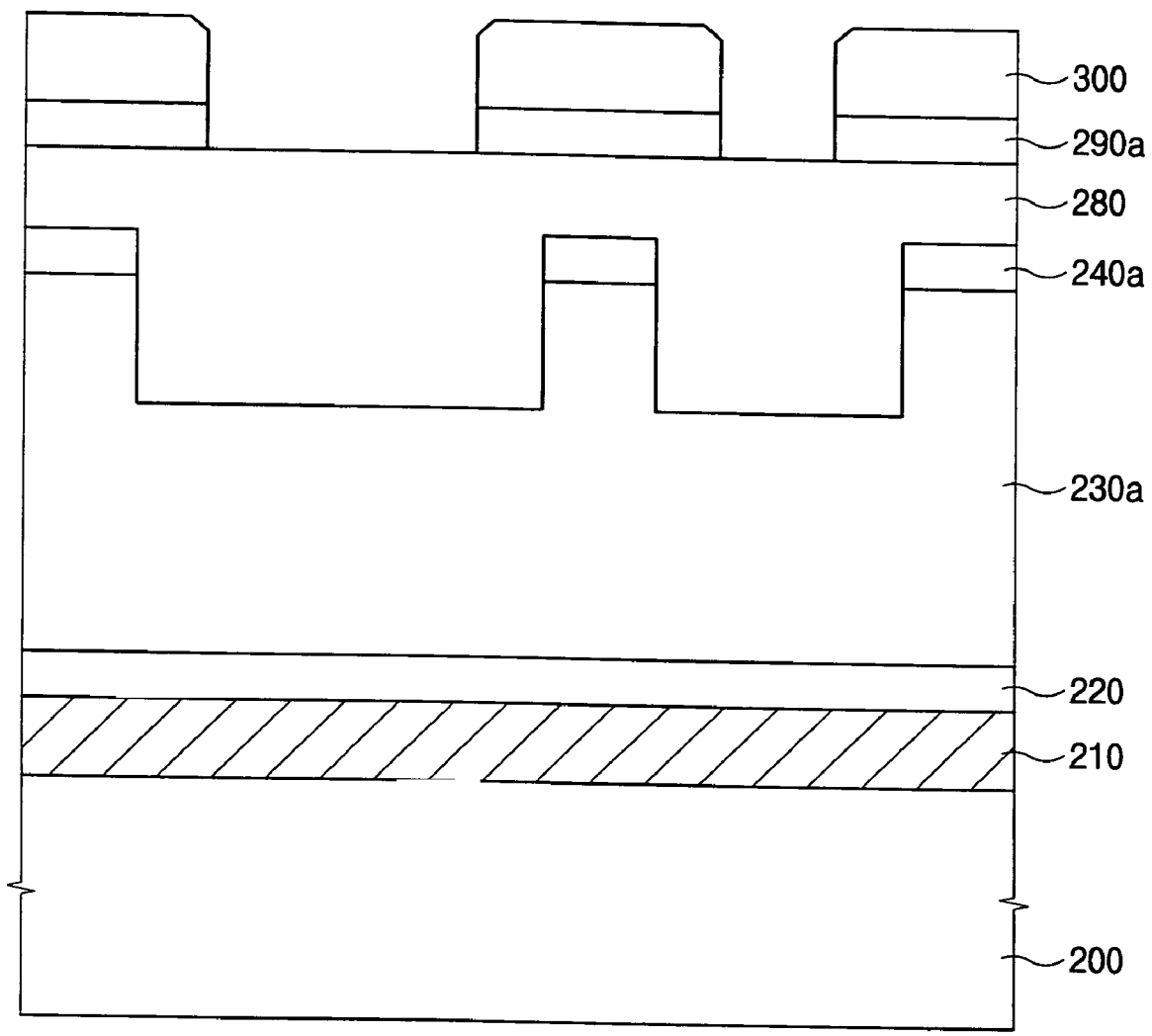

Referring to FIG. 3G, second mask layer 290 is partially removed using third mask pattern 300, thus forming a second mask pattern 290a on first mask layer 280. Second mask layer 290 is partially dry-etched using third mask pattern 300 as an etching mask. After second mask pattern 290a is formed, third mask pattern 300 is removed from second mask pattern 290a.

Figure 3H:
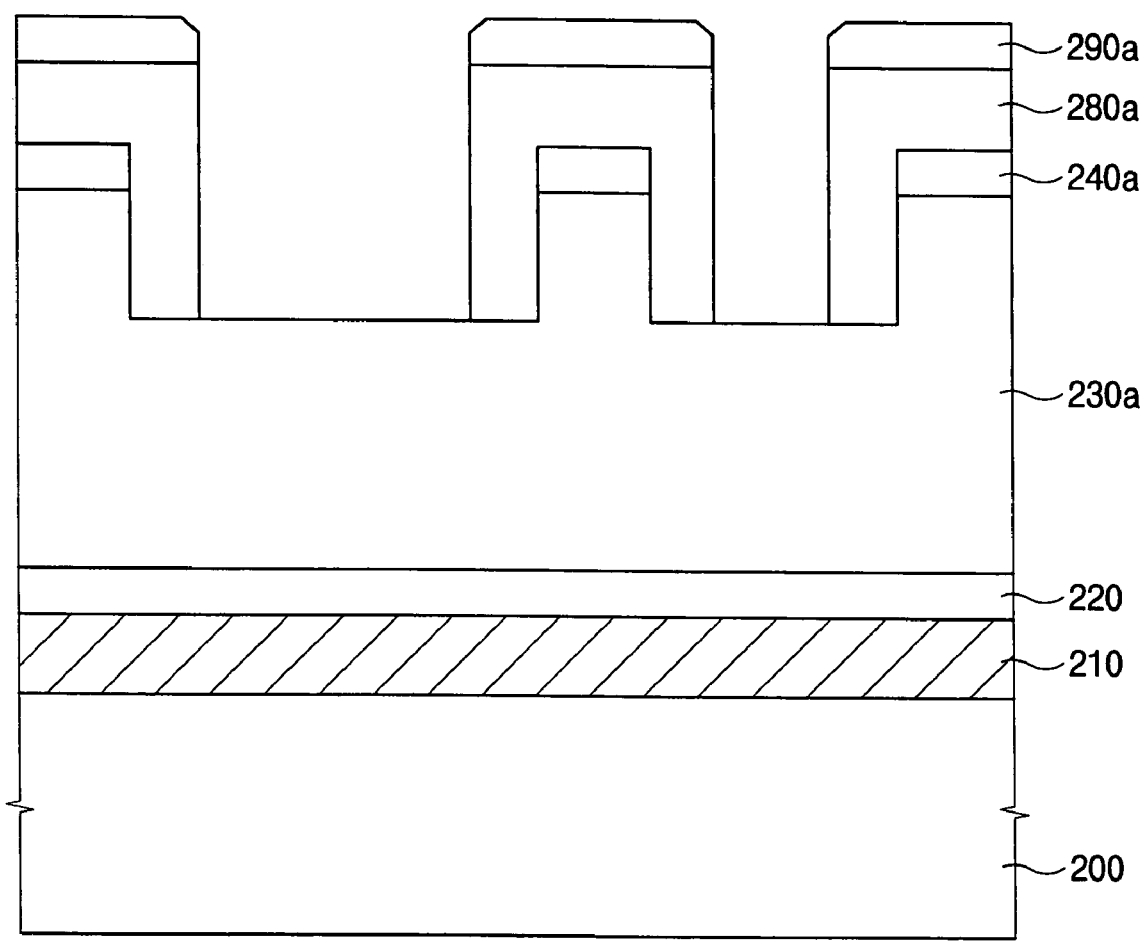
Figure 31:
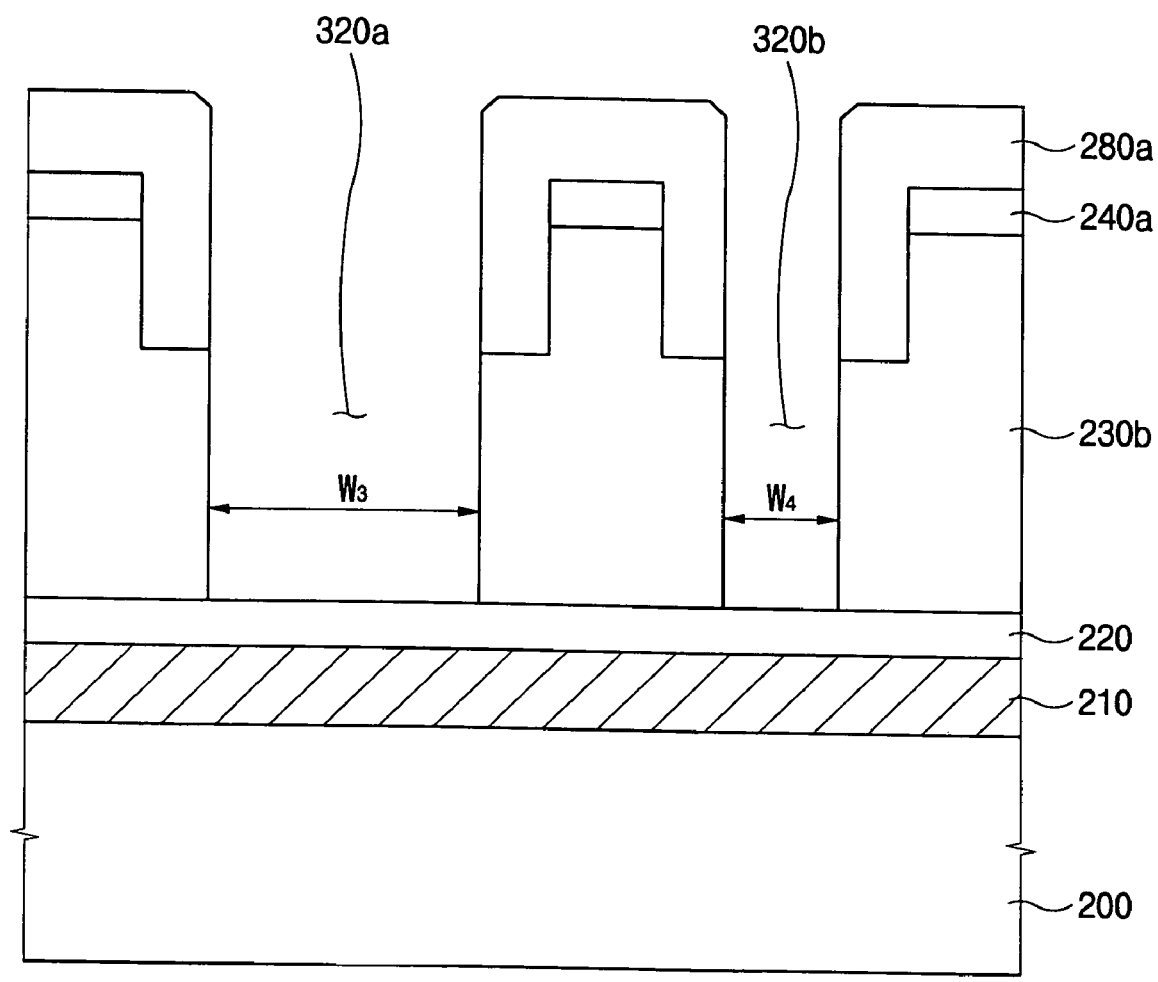

Referring to FIG. 3H, first mask layer 280 is partially removed using second mask pattern 290a, thus forming a first mask pattern 280a. First mask layer 280 is partially dry-etched using second mask pattern 290a as an etching mask. After first mask pattern 280a is formed, second mask pattern 290a is removed from first mask pattern 280a.

Referring to FIG. 3I, a portion of insulating interlayer 230a is removed using first mask pattern 280a, so that at least one via-hole partially exposing first stopping layer 220 is formed. The remaining portion of insulating interlayer 230a is referred to as insulating interlayer 230b.

As a result of removing the portion of insulating interlayer 230a, third and fourth openings 320a and 320b are formed and first stopping layer 220 is partially exposed through third and fourth openings 320a and 320b. Third opening 320a is formed to correspond to first opening 270a and fourth opening 320b is formed to correspond to second opening 270b. Third opening 320a has a third width W3, which is smaller than first width W1, and fourth opening 320b has a fourth width W4, which is smaller than second width W2. Preferably, third and fourth openings 320a and 320b function as via-holes. For example, third opening 320a preferably functions as a first via-hole formed in a pad region and fourth opening 320b preferably functions as a second via-hole formed in a cell region. Accordingly, the first trench having first width W1 and the first via-hole having third width W3 are formed in the pad region, and the second trench having second width W2 and the second via-hole having fourth width W4 are formed in the cell region.

First stopping layer 220 is preferably further removed after insulating interlayer 230a is partially removed in order for first conductive layer 210 to be electrically connected with a second conductive layer (not shown) in a subsequent process.

Figure 3J:
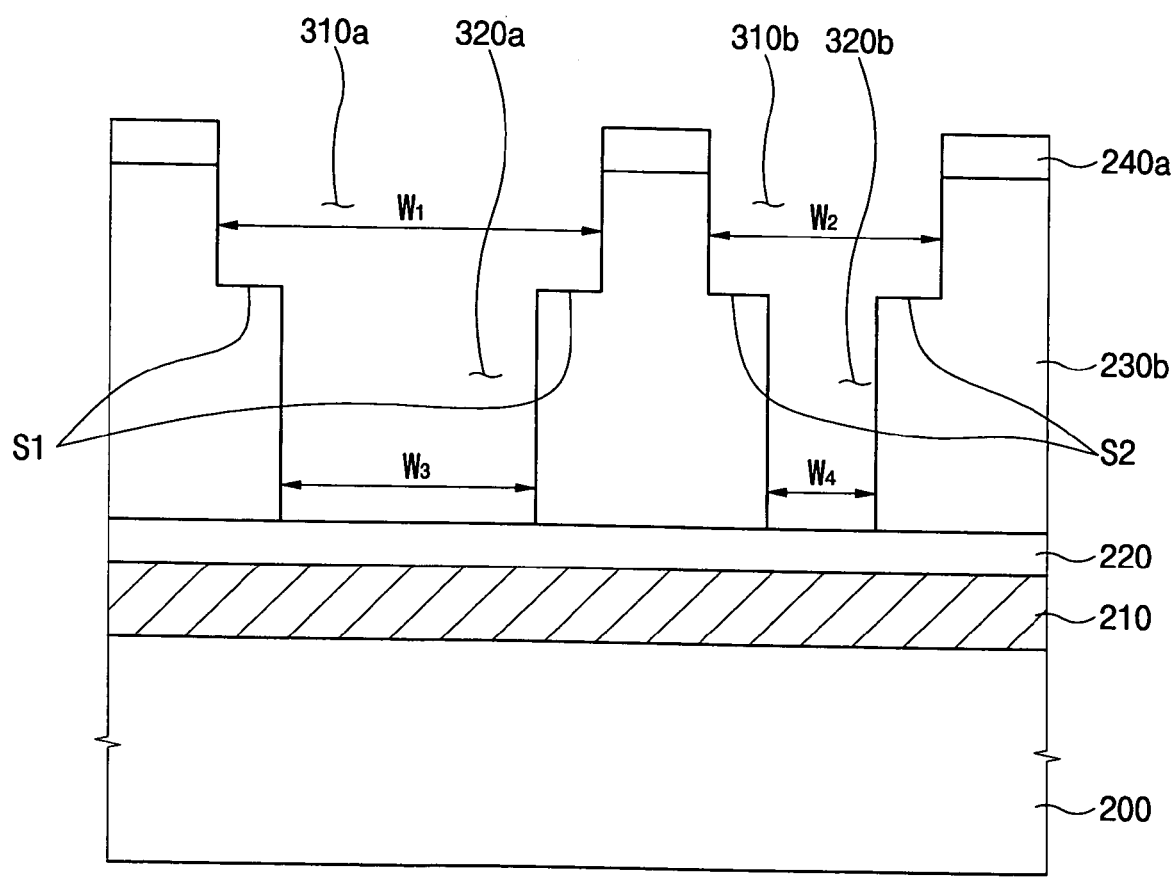

Referring to FIG. 3J, after third and fourth openings 320a and 320b are formed, first mask pattern 280a is completely removed. Accordingly, first opening 270a is connected to third opening 320a, and second opening 270b is connected to fourth opening 320b.

Insulating interlayer 230b has a first stepped portion S1 due to the difference between first width W1 and third width W3 and a second stepped portion S2 due to the difference between second width W2 and fourth width W4. In other words, the first trench is connected to the first via-hole, which has a smaller width than first trench, and the second trench is connected to the second via-hole, which has a smaller width than the second trench. Second stopping layer 220 is partially exposed through the first and second via-holes and trenches.

First mask pattern 280a is preferably removed by an ashing process or a stripping process using a material having an etch selectivity relative to insulating interlayer 230b, first stopping layer 220, and second stopping layer 240a.

FIGS. 4A through 4J are cross-sectional views illustrating steps of a method for forming metal wiring of the semiconductor device according to another exemplary embodiment of the present invention. The metal wiring is formed by a dual damascene process in which a trench is formed prior to a via-hole, contrary to a conventional dual damascene process in which the via-hole is formed prior to the trench.

Figure 4A:
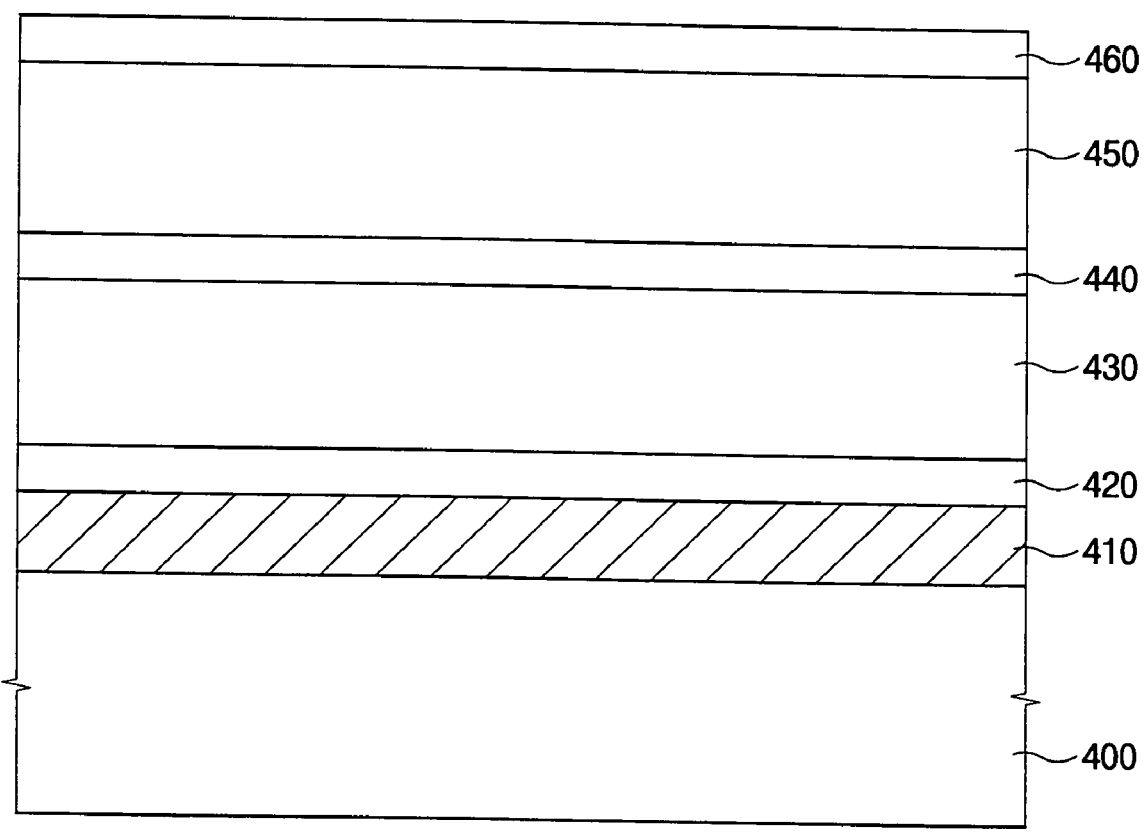

Referring to FIG. 4A, a first conductive layer 410 is formed on a semiconductor substrate 400 and a first stopping layer 420 is formed on first conductive layer 410. A first insulating interlayer 430, a second stopping layer 440, a second insulating interlayer 450 and a third stopping layer 460 are successively formed on first stopping layer 420.

First conductive layer 410 preferably comprises copper and first stopping layer 420 preferably comprises silicon nitride (SiN), silicon carbide (SiC), or silicon carbon nitride (SiCN). First stopping layer 420 preferably has an etch selectivity relative to second insulating interlayer 450. First stopping layer 420 stops a removing process, such as an etching process, used to form a via-hole. First insulating interlayer 430 preferably comprises silicon oxycarbide (SiOC), fluorine doped silicate glass (FSG), or spin-on-glass (SOG) having a low dielectric constant. Second stopping layer 440 preferably comprises silicon nitride (SiN), silicon carbide (SiC), or silicon carbon nitride (SiCN) having an etch selectivity relative to that of second insulating interlayer 450. Second stopping layer 440 stops a removing process, such as an etching process, used to form a trench. Second insulating interlayer 450 comprises silicon oxycarbide (SiOC), fluorine doped silicate glass (FSG), or spin-on-glass (SOG) having a low dielectric constant. Third stopping layer 460 comprises fluorine doped silicate glass (FSG) or undoped silicate glass (USG) having a low dielectric constant. Third stopping layer 460 stops a CMP process used to planarize a layer.

Figure 4B:
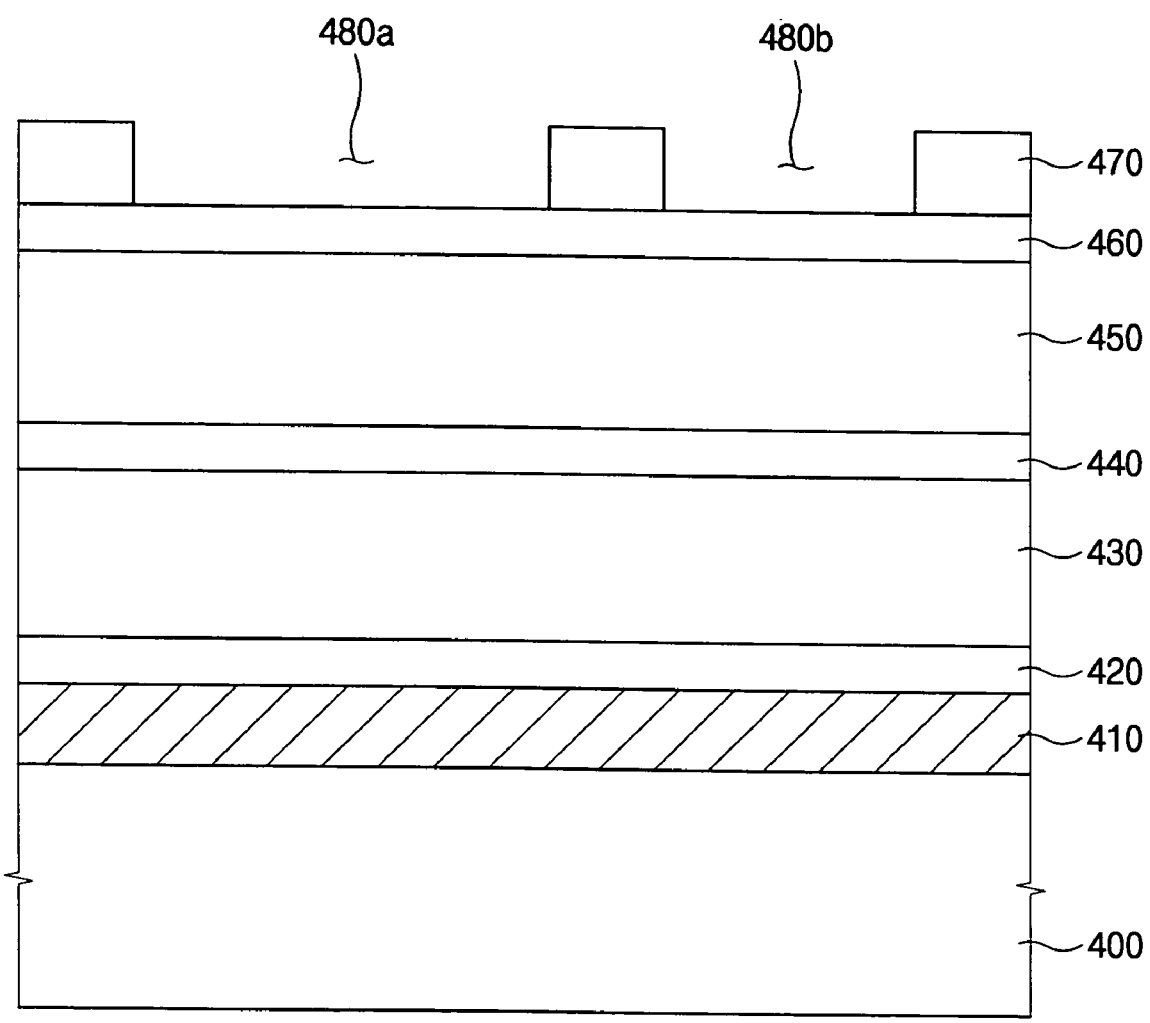

Referring to FIG. 4B, a preliminary pattern 470 is formed on third stopping layer 460. Preliminary pattern 470 comprises first and second trench regions 480a and 480b, which partially expose third stopping layer 460. First trench region 480a is wider than second trench region 480b. Therefore, a portion of third stopping layer 460 exposed through first trench region 480a is wider than a portion of third stopping layer 460 exposed through second trench region 480b. Accordingly, first trench region 480a forms a wide pattern such as a trench in a pad region, and second trench region 480b forms a narrow pattern such as a trench in a cell region that is strongly constrained by a design rule of a semiconductor device.

Preliminary pattern 470 is typically formed by first coating a preliminary mask layer (not shown) on third stopping layer 460, and then partially removing the preliminary mask, thereby completing preliminary pattern 470 including first and second trench regions 480a and 480b.

Figure 4C:
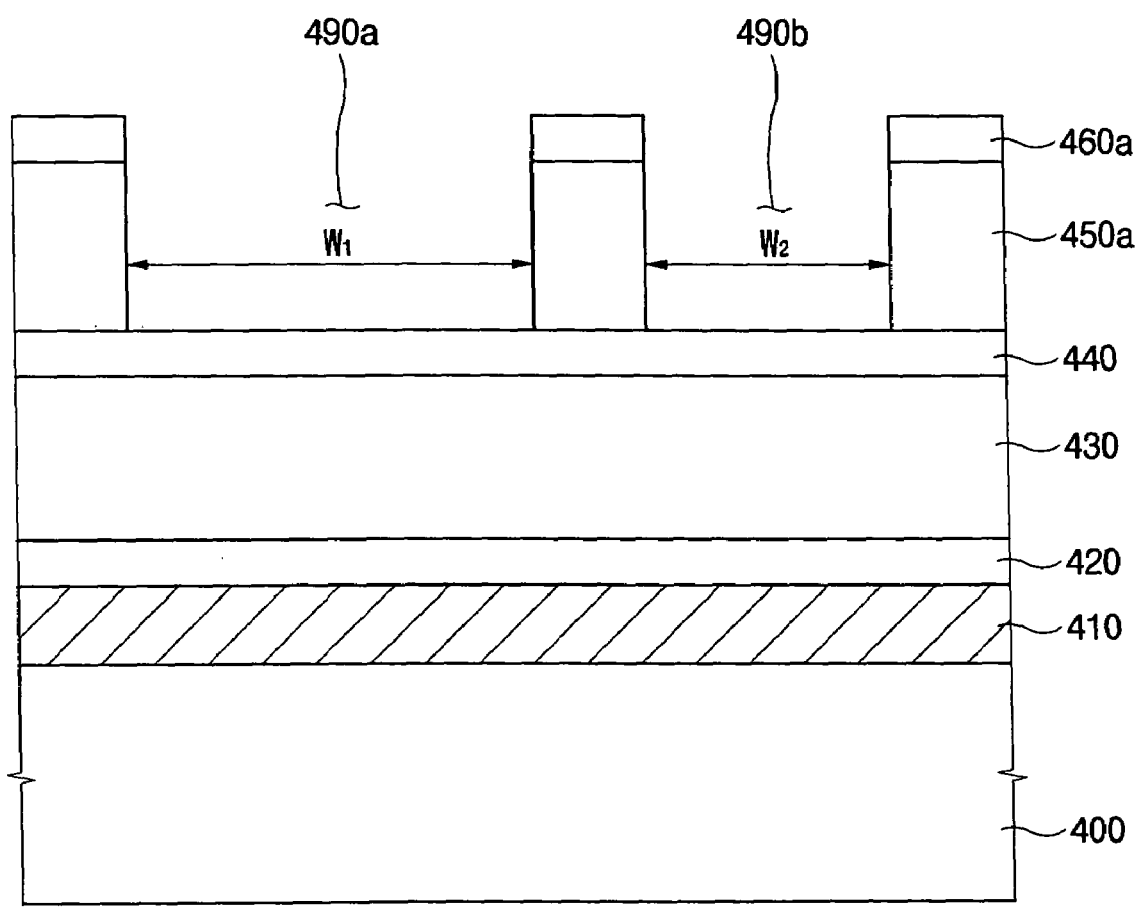

Referring to FIG. 4C, portions of third stopping layer 460 and second insulating interlayer 450 are removed using preliminary pattern 470 as a mask. Following this removal, second insulating interlayer 450 and third stopping layer 460 are respectively referred to as second insulating interlayer 450a and third stopping layer 460a.

A first opening 490a and a second opening 490b exist where portions of second insulating interlayer 450 and third stopping layer 460 were removed. Accordingly, second stopping layer 440 is partially exposed through first and second openings 490a and 490b. First opening 490a has a first width W1, and second opening 490b has a second width W2, which is smaller than first width W1. First and second openings 490a and 490b preferably function as trenches in a wafer. First opening 490a preferably functions as a first trench having first width W1 and is typically formed in a pad region. Second opening 490b preferably functions as a second trench having second width W2 and is typically formed in a cell region. After first and second openings 490a and 490b are formed, preliminary pattern 470 is completely removed from third stopping layer 460a.

Figure 4D:
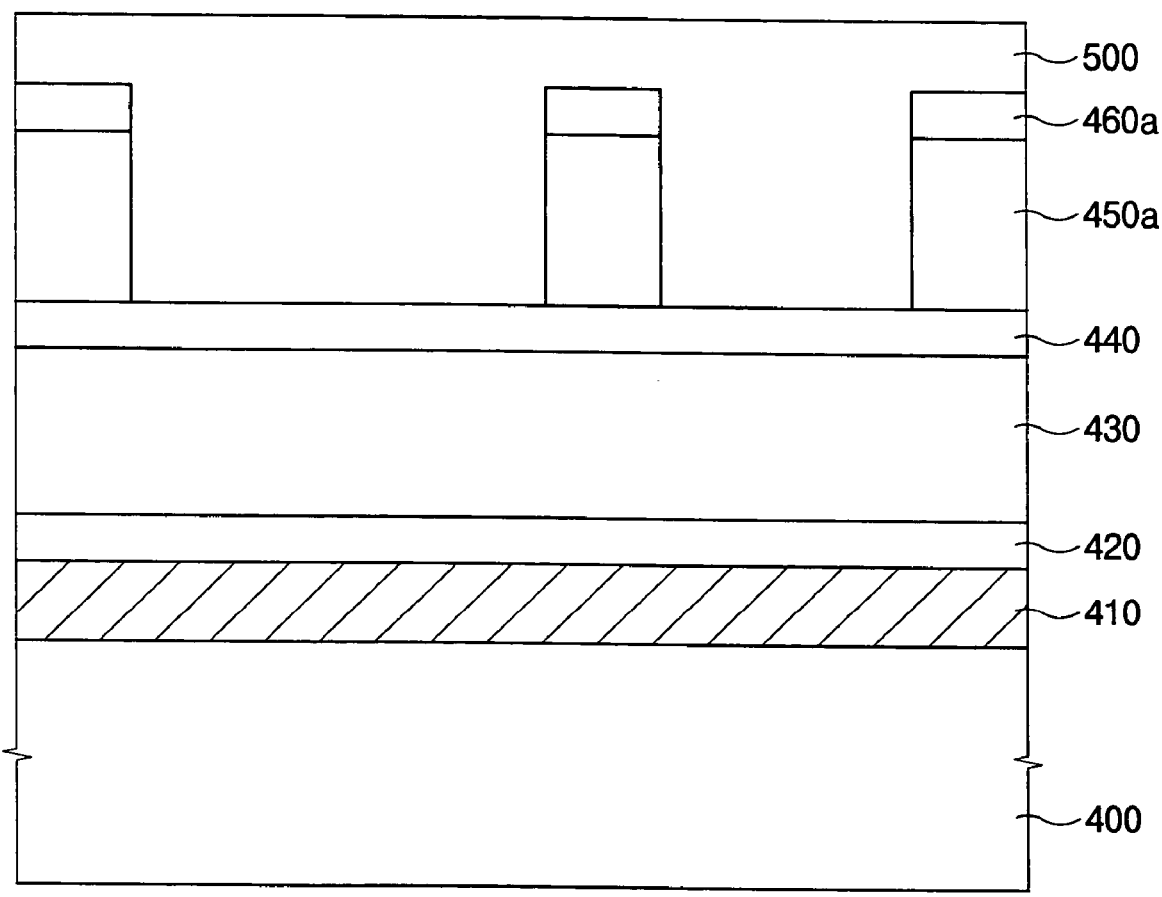

Referring to FIG. 4D, a first mask layer 500 filling first and second openings 490a and 490b is formed on third stopping layer 460a. First mask layer 500 is coated on third stopping layer 460a to a predetermined thickness sufficient to fill first and second openings 490a and 490b. First mask layer 500 preferably includes a photoresist film sensitive to an I-line ray or a krypton fluoride (KrF) excimer laser, or a material layer including a spin-on-glass (SOG) based material. Where first mask layer 500 is excessively thick relative to a top surface of third stopping layer 460a, first mask layer 500 is planarized to reduce the thickness thereof, thereby preventing a process failure due to a large distance between a top surface of first mask layer 500 and a bottom surface of first and second openings 490a and 490b. For example, a focus failure is typically prevented from occurring in a photolithography process for forming a wide pattern such as first opening 490a by reducing the thickness of first mask layer 500.

Figure 4E:
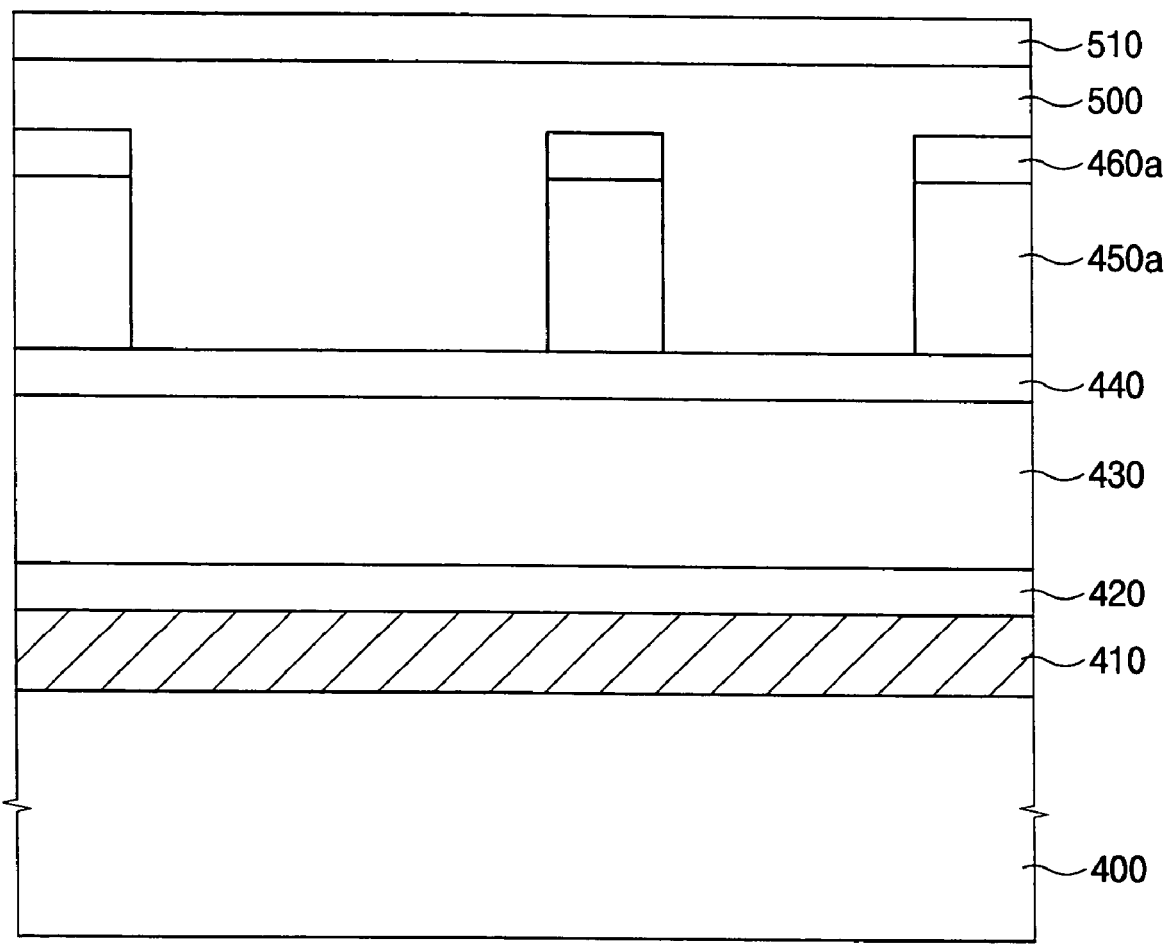

Referring to FIG. 4E, a second mask layer 510 is formed on first mask layer 500. Second mask layer 510 preferably comprises a SOG-based material including carbon (C) and preferably has an etch selectivity relative to first mask layer 500, second stopping layer 440, and first insulating interlayer 430.

Figure 4F:
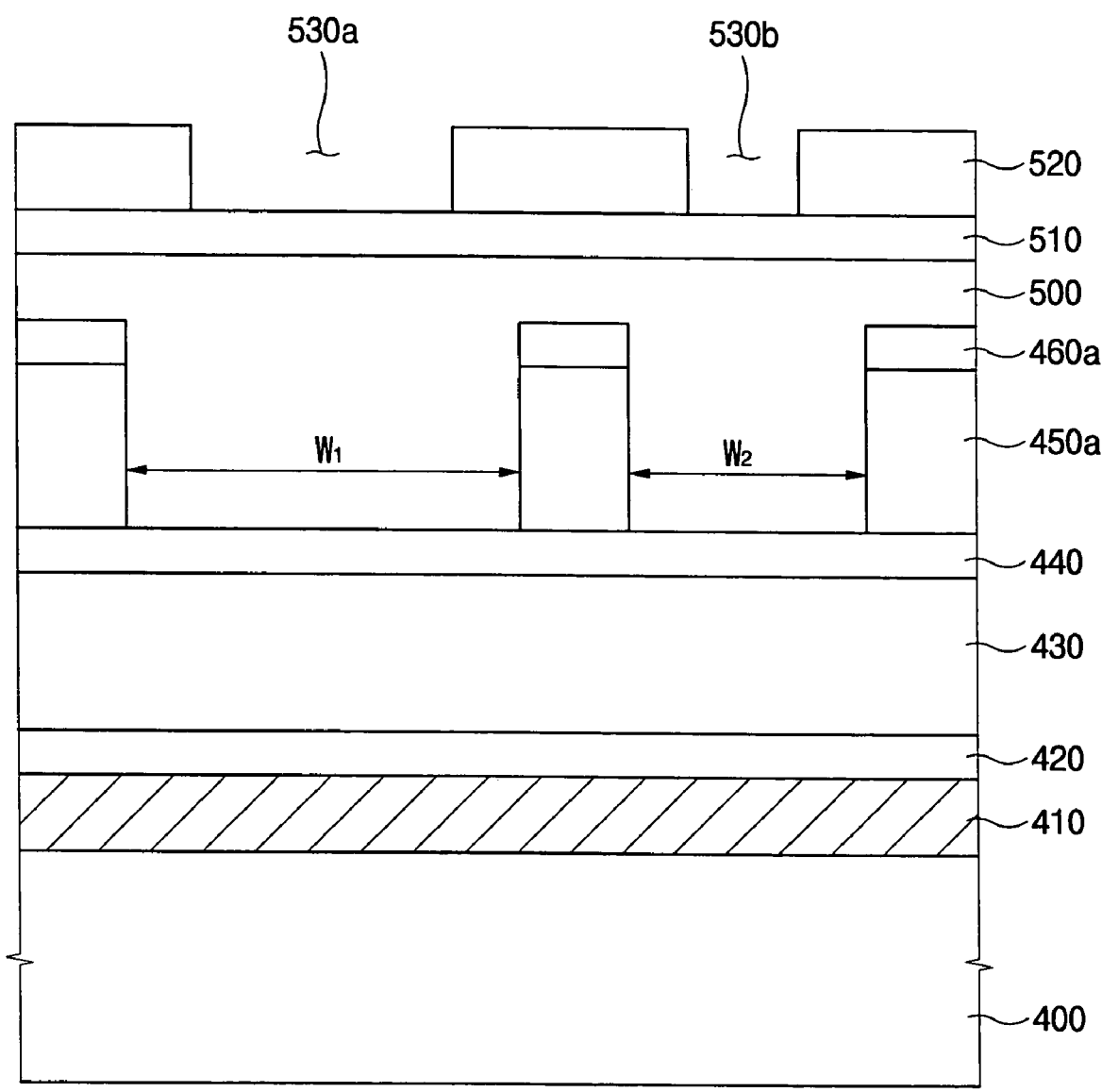
Figure 4G:
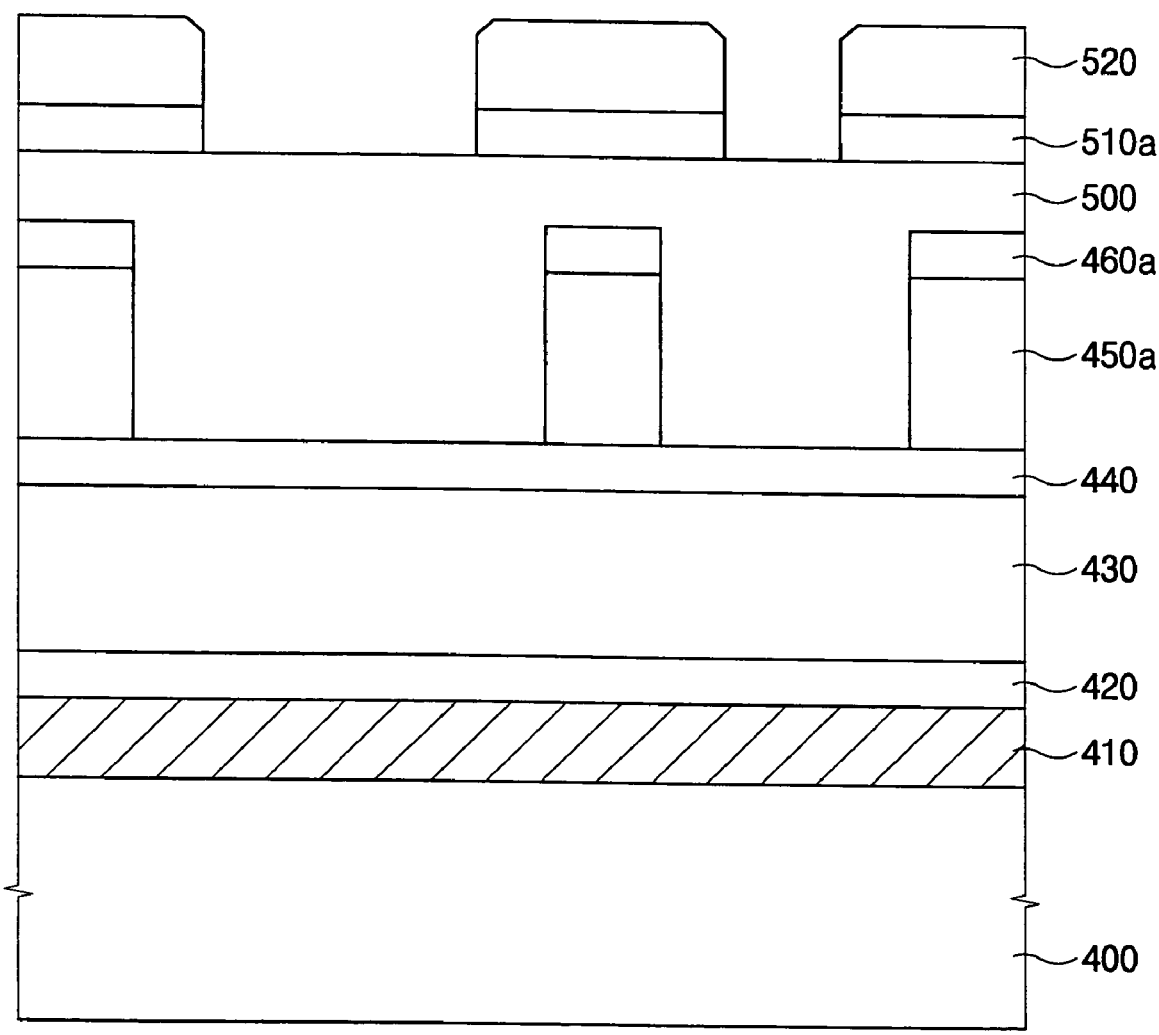

Referring to FIG. 4F, a third mask pattern 520 is formed on second mask layer 510 in order to form via-holes in a subsequent process. Third mask pattern 520 comprises a first via-hole region 530a and a second via-hole region 530b, which partially expose second mask layer 510. First via-hole region 530a is wider than second via-hole region 530b, and therefore a portion of second mask layer 510 exposed through first via-hole region 530a is wider than a portion of second mask layer 510 exposed through second via-hole region 530b.

Third mask pattern 520 is formed by coating a third mask layer (not shown) on second mask layer 510 and then partially removing third mask layer to form first and second via-hole regions 530a and 530b.

First via-hole region 530a is formed to correspond to first trench region 480a and second via-hole region 530b is formed to correspond to second trench region 480b. In addition, first via-hole region 530a is formed to be narrower than first trench region 480a, and second via-hole region 530b is formed to be narrower than second trench region 480b. Accordingly, via-holes formed by using first and second via-hole regions 530a or 530b are narrower than their respective trench counterparts formed by using first and second trench regions 480a or 480b.

Referring to FIG. 4Q second mask layer 510 is partially removed using third mask pattern 520 as a mask. As a result, a second mask pattern 510a is formed on first mask layer 500. Second mask layer 510 is preferably partially dry-etched using third mask pattern 520 as an etching mask. After second mask pattern 510a is formed, third mask pattern 520 is removed from second mask pattern 510a.

Figure 4H:
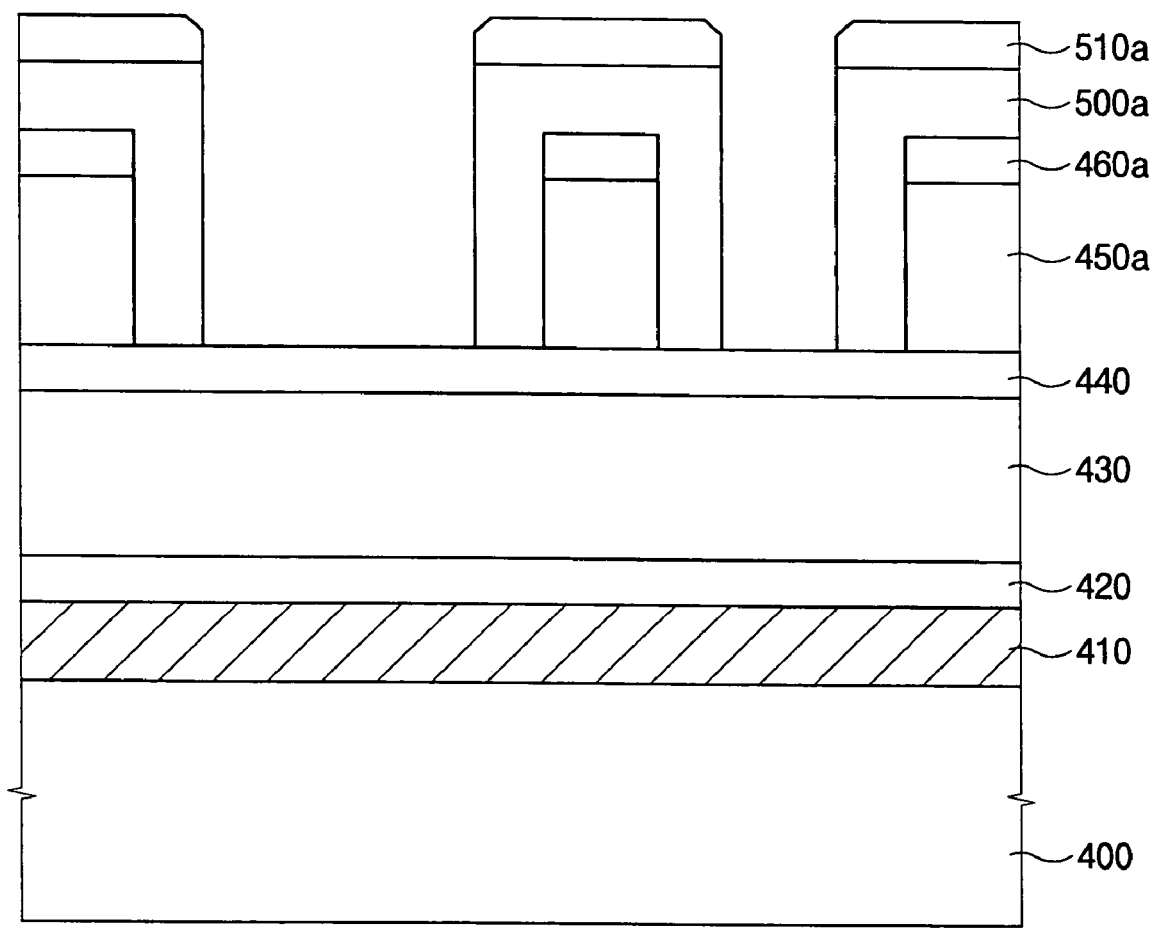
Figure 41:
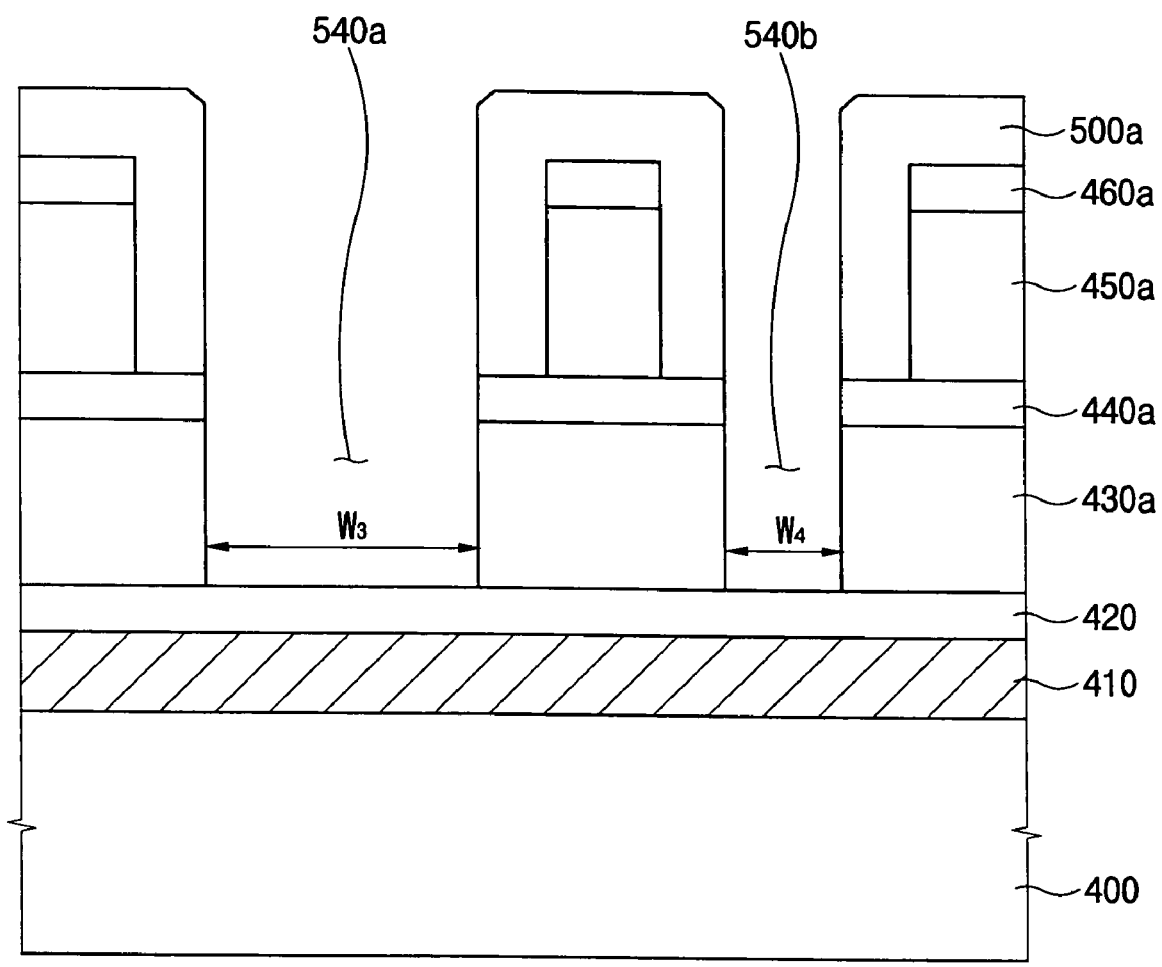

Referring to FIG. 4H, first mask layer 500 is partially removed using second mask pattern 510a. As a result, a first mask pattern 500a is formed. First mask layer 500 is partially dry-etched using second mask pattern 510a as an etching mask. After first mask pattern 500a is formed, second mask pattern 510a is removed from first mask pattern 500a.

Referring to FIG. 4I, portions of second stopping layer 440 and first insulating interlayer 430 are removed using first mask pattern 500a, so that a third opening 540a and a fourth opening 540b are formed. Following this removing process, second stopping layer 440 is referred to as second stopping layer 440a and first insulating interlayer 430 is referred to as first insulating interlayer 430a. First stopping layer 420 is partially exposed through third and fourth openings 540a and 540b.

Third opening 540a is formed to correspond to first opening 490a and fourth opening 540b is formed to correspond to second opening 490b. Third opening 540a has a third width W3 smaller than first width W1 of first opening 490a and fourth opening 540b has a fourth width W4 smaller than second width W2 of second opening 490b. Third and fourth openings 540a and 540b function as via-holes in a wafer. Third opening 540a typically functions as a first via-hole formed in a pad region of the wafer and fourth opening 540b typically functions as a second via-hole formed in a cell region of the wafer. Accordingly, the first trench having first width W1 and the first via-hole having third width W3 are formed in the pad region of the wafer, and the second trench having second width W2 and the second via-hole having fourth width W4 are formed in the cell region of the wafer.

First stopping layer 420 is preferably further removed when first insulating interlayer 430 is removed in order for first conductive layer 410 to be electrically connected with a second conductive layer (not shown) in a subsequent process.

Figure 4J:
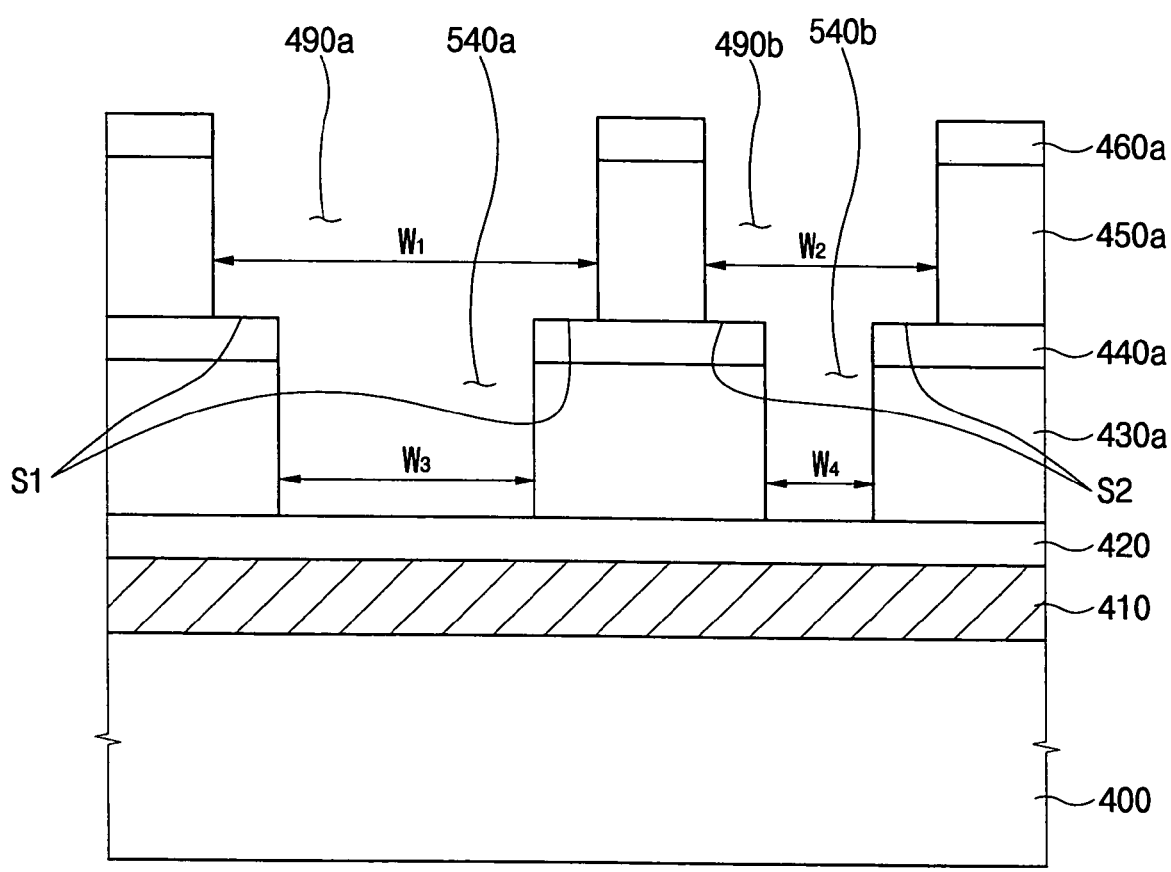

Referring to FIG. 4J, after third and fourth openings 540a and 540b are formed, first mask pattern 500a is completely removed. Accordingly, first opening 490a is connected to third opening 540a and second opening 490b is connected to fourth opening 540b.

As a result of removing first mask pattern 500a, second stopping layer 440a has a stepped portion S1 due to a difference between width W1 of the first trench and width W3 of the first via-hole, and a second stepped portion S2 due to a difference between width W2 of the second trench and width W4 of the second via-hole. The first trench is connected to the first via-hole having a smaller width than the width of the first trench, and the second trench is connected to the second via-hole having a smaller width than the width of the second trench.

First stopping layer 420 is partially exposed through the first and second via-holes and trenches. First mask pattern 500a is removed by an ashing process or a stripping process using a material having an etch selectivity relative to first insulating interlayer 430a, second insulating interlayer 450a, and first through third stopping layers 420, 440a and 460a.

According to the present invention, via-holes and trenches used to form a metal wiring in a semiconductor device are formed in accordance with design conditions and shape which allow the electrical characteristics of the metal wiring to be maintained without alteration. In particular, an electrical short due to wiring failures is sufficiently prevented.

The preferred embodiments disclosed in the drawings and the corresponding written description are teaching examples. Those of ordinary skill in the art will understand that various changes in form and details may be made to the exemplary embodiments without departing from the scope of the present invention which is defined by the following claims.

What is claimed is:

1. A method of forming metal wiring in a semiconductor device, comprising:
   forming a first stopping layer on a semiconductor substrate on which a conductive layer is formed;
   forming an insulating interlayer on the first stopping layer;
   forming a second stopping layer on the insulating interlayer;
   forming a preliminary layer on the second stopping layer;
   partially removing the preliminary layer to form a preliminary pattern, the preliminary pattern defining a trench region by exposing a top surface of the second stopping layer, wherein the trench region has a first width;
   partially removing the second stopping layer and a portion of the insulating interlayer using the preliminary pattern, thereby forming a trench of first width;
   forming a first mask layer on the second stopping layer, wherein the first mask layer fills the trench;
   forming a second mask layer on the first mask layer;
   forming a third mask layer on the second mask layer;
   partially removing the third mask layer to form a third mask pattern, the third mask pattern defining a via-hole region by exposing a top surface of the second mask layer, wherein the via-hole region has a second width smaller than the first width;
   partially removing the second mask layer using the third mask pattern, thereby forming a second mask pattern;
   partially removing the first mask layer using the second mask pattern, thereby forming a first mask pattern;
   partially removing the insulating interlayer using the first mask pattern, thereby forming a via-hole of second width partially exposing the first stopping layer.

2. The method of claim 1, further comprising:
   removing an exposed portion of the first stopping layer, thereby exposing the conductive layer.

3. The method of claim 1, wherein the first mask layer comprises a photoresist film sensitive to an I-line ray or a krypton fluoride (KrF) excimer laser, or a material layer including a spin-on-glass (SOG) based material.

4. The method of claim 1, wherein forming the first mask layer comprises:
   coating the first mask layer on the second stopping layer to a predetermined thickness sufficient to fill the trench; and
   planarizing the first mask layer.

5. The method of claim 1, wherein removing the first mask pattern comprises:
   performing an ashing process or a stripping process using a material having an etch selectivity relative to the insulating interlayer, the first stopping layer, and the second stopping layer.

6. The method of claim 1, wherein the second mask layer comprises a spin-on-glass (SOG) based material including carbon (C) having an etch selectivity relative to the first mask layer and the insulating interlayer.

7. The method of claim 1, wherein the conductive layer comprises copper.

8. The method of claim 1, wherein the insulating interlayer comprises silicon oxycarbide (SiOC), fluorine doped silicate glass (FSG), or spin-on-glass (SOG) having a low dielectric constant.

9. The method of claim 1, wherein the first stopping layer comprises silicon nitride (SiN), silicon carbide (SiC), or silicon carbon nitride (SiCN) having an etch selectivity relative to the insulating interlayer.

10. The method of claim 1, wherein the second stopping layer comprises fluorine doped silicate glass (FSG) or undoped silicate glass (USG) having a low dielectric constant.

11. A method of forming metal wiring in a semiconductor device, comprising:
    forming a first stopping layer on a semiconductor substrate on which a conductive layer is formed;
    forming a first insulating interlayer on the first stopping layer;
    forming a second stopping layer on the first insulating interlayer;
    forming a second insulating interlayer on the second stopping layer;
    forming a third stopping layer on the second insulating interlayer;
    forming a preliminary layer on the third stopping layer;
    partially removing the preliminary layer to form a preliminary pattern, the preliminary pattern defining a trench region by exposing a top surface of the third stopping layer, wherein the trench region has a first width;
    partially removing the third stopping layer and a portion of the second insulating interlayer using the preliminary pattern, thereby forming a trench of first width partially exposing a top surface of the second stopping layer;
    forming a first mask layer on the third stopping layer, wherein the first mask layer fills the trench;
    forming a second mask layer on the first mask layer;
    forming a third mask layer on the second mask layer;
    partially removing the third mask layer to form a third mask pattern, the third mask pattern defining a via-hole region by exposing a top surface of the second mask layer, wherein the via-hole region has a second width smaller than the first width;
    partially removing the second mask layer using the third mask pattern, thereby forming a second mask pattern;
    partially removing the first mask layer using the second mask pattern, thereby forming a first mask pattern;
    partially removing the second stopping layer and the first insulating interlayer, thereby forming a via-hole of second width partially exposing the first stopping layer.

12. The method of claim 11, wherein forming the first mask layer comprises:
    coating the first mask layer on the third stopping layer to a predetermined thickness sufficient to fill the trench; and,
    planarizing the first mask layer.

13. The method of claim 11, wherein the first stopping layer comprises silicon nitride (SiN), silicon carbide (SiC), or silicon carbon nitride (SiCN) having an etch selectivity relative to the first insulating interlayer.

14. The method of claim 11, wherein the second stopping layer comprises silicon nitride (SiN), silicon carbide (SiC), or silicon carbon nitride (SiCN) having an etch selectivity relative to the second insulating interlayer.

15. The method of claim 11, wherein the third stopping layer comprises fluorine doped silicate glass (FSG) or undoped silicate glass (USG) having a low dielectric constant.

16. The method of claim 11, wherein the conductive layer comprises copper.

17. The method of claim 11, further comprising:
removing an exposed portion of the first stopping layer, thereby exposing the conductive layer.

18. The method of claim 11, wherein the second mask layer comprises a spin-on-glass (SOG) based material including carbon (C) having an etch selectivity relative to the first mask layer, the second stopping layer, and the first insulating interlayer.

19. The method of claim 11, wherein the second insulating interlayer comprises silicon oxycarbide (SiOC), fluorine doped silicate glass (FSG), or spin-on-glass (SOG) having a low dielectric constant.

20. The method of claim 11, wherein removing the first mask pattern comprises:

performing an ashing process or a stripping process using a material having an etch selectivity relative to the first insulating interlayer, the second insulating interlayer, and the first through third stopping layers.

* * * * *